United States Patent
Sheehan et al.

(10) Patent No.: US 11,602,069 B2
(45) Date of Patent: Mar. 7, 2023

(54) BASE ELECTRICAL MODULE FOR MODULAR DATA CENTER

(71) Applicant: SCHNEIDER ELECTRIC IT CORPORATION, Foxboro, MA (US)

(72) Inventors: Stuart Michael Sheehan, Narragansett, RI (US); Tannan Whidden Winter, Fitchburg, MA (US); Deborah Marie Dailey, Centreville, VA (US); Karl Duncan Langmuir, Providence, RI (US); Kevin Robert Brown, Portsmouth, RI (US)

(73) Assignee: SCHNEIDER ELECTRIC IT CORPORATION, Foxboro, MA (US)

( * ) Notice: Subject to any disclaimer, the term of this patent is extended or adjusted under 35 U.S.C. 154(b) by 87 days.

(21) Appl. No.: 17/172,921

(22) Filed: Feb. 10, 2021

(65) Prior Publication Data

US 2021/0251101 A1    Aug. 12, 2021

Related U.S. Application Data

(60) Provisional application No. 62/975,030, filed on Feb. 11, 2020.

(51) Int. Cl.
*H05K 7/14* (2006.01)
*H05K 7/18* (2006.01)
*H05K 7/20* (2006.01)

(52) U.S. Cl.
CPC ............. *H05K 7/1492* (2013.01); *H05K 7/18* (2013.01); *H05K 7/20736* (2013.01); *H05K 7/20754* (2013.01)

(58) Field of Classification Search
CPC ...... H05K 7/1492; H05K 7/1494; H05K 7/18; H05K 7/20736; H05K 7/20754
See application file for complete search history.

(56) References Cited

U.S. PATENT DOCUMENTS 4,258,967 A * 3/1981 Boudreau ............ H05K 7/1421
312/273
5,169,221 A * 12/1992 Wheeler ................. H05K 7/16
248/299.1

(Continued)

FOREIGN PATENT DOCUMENTS

| EP | 1061621 A1 | 12/2000 |
|---|---|---|
| EP | 3509405 A1 | 7/2019 |
| WO | 2007145538 A3 | 2/2008 |

OTHER PUBLICATIONS

Arrmarac MX-800-N4X, Installation and Operation Guide, Revision 1.1, Sep. 2015, pp. 1-56.

(Continued)

*Primary Examiner* — Adrian S Wilson
(74) *Attorney, Agent, or Firm* — Lando & Anastasi, LLP

(57) ABSTRACT

A modular data center includes a base electrical module having a casing, a controller supported by the casing, and a power distribution unit coupled to the controller. The modular data center further includes an equipment rack having a frame coupled to the base electrical module, with the frame of the equipment rack being configured to receive electronic equipment. The electronic equipment receives power from the base electrical module. The base electrical module is external to the equipment rack.

26 Claims, 32 Drawing Sheets

(56) References Cited

U.S. PATENT DOCUMENTS

| | | | |
|---|---|---|---|
| 5,452,951 A | 9/1995 | Peller | |
| 5,506,750 A * | 4/1996 | Carteau | G11B 33/128 |
| 5,584,396 A * | 12/1996 | Schmitt | H05K 7/16 |
| | | | 211/26 |
| 5,995,364 A * | 11/1999 | McAnally | G06F 1/187 |
| | | | 361/725 |
| 6,025,989 A * | 2/2000 | Ayd | G06F 1/183 |
| | | | 312/236 |
| 6,038,126 A * | 3/2000 | Weng | G06F 1/189 |
| | | | 361/679.01 |
| 6,137,684 A * | 10/2000 | Ayd | H05K 7/1411 |
| | | | 361/608 |
| 6,215,664 B1 * | 4/2001 | Hernandez | G06F 1/188 |
| | | | 361/732 |
| 6,270,046 B1 * | 8/2001 | Liu | G06F 1/184 |
| | | | 248/231.9 |
| 6,386,656 B1 * | 5/2002 | Chen | G06F 1/184 |
| | | | 312/223.2 |
| 6,427,936 B1 | 8/2002 | Noel et al. | |
| 6,430,041 B1 * | 8/2002 | Johnson | G06F 1/181 |
| | | | 361/679.48 |
| 6,530,551 B2 * | 3/2003 | Gan | G11B 33/128 |
| | | | 312/265.5 |
| 6,538,879 B2 * | 3/2003 | Jiang | G06F 1/184 |
| | | | 312/223.1 |
| 6,685,503 B1 * | 2/2004 | Huang | G06F 1/184 |
| | | | 439/527 |
| 6,741,463 B1 * | 5/2004 | Akhtar | H05K 7/1421 |
| | | | 361/679.41 |
| 6,781,841 B2 * | 8/2004 | Kim | G11B 33/128 |
| 6,813,156 B2 * | 11/2004 | Park | G06F 1/181 |
| | | | 361/721 |
| 6,819,560 B2 * | 11/2004 | Konshak | G06F 1/184 |
| | | | 361/679.5 |
| 7,254,018 B2 * | 8/2007 | Zhang | G06F 1/187 |
| | | | 361/679.33 |
| 7,257,827 B2 * | 8/2007 | Lee | G11B 33/022 |
| 7,277,273 B2 * | 10/2007 | Smith | H05K 7/1488 |
| | | | 361/679.01 |
| 7,346,913 B2 * | 3/2008 | Ishimine | G11B 33/128 |
| 7,535,717 B2 * | 5/2009 | Lai | G06F 1/181 |
| | | | 361/727 |
| 7,542,269 B2 * | 6/2009 | Chen | G06F 1/188 |
| | | | 361/679.02 |
| 7,558,971 B2 * | 7/2009 | Casebolt | G05F 5/00 |
| | | | 361/752 |
| 7,639,486 B2 * | 12/2009 | Champion | G06F 1/183 |
| | | | 713/320 |
| 7,690,944 B2 * | 4/2010 | Matsumura | H01R 31/06 |
| | | | 439/578 |
| 7,716,408 B2 * | 5/2010 | Bhatia | G06F 1/189 |
| | | | 710/72 |
| 7,719,848 B2 * | 5/2010 | Widmayer | H05K 7/1425 |
| | | | 361/752 |
| 7,835,154 B2 * | 11/2010 | Kunkle | H05K 7/1457 |
| | | | 361/728 |
| 8,072,751 B2 * | 12/2011 | Farrow | G06F 1/183 |
| | | | 361/679.6 |
| 8,231,396 B2 * | 7/2012 | Kangas | H05K 7/1411 |
| | | | 439/172 |
| 8,582,299 B1 * | 11/2013 | Phillips | H05K 7/1492 |
| | | | 361/727 |
| 10,117,359 B2 * | 10/2018 | Kang | H05K 7/20554 |
| 10,212,840 B2 * | 2/2019 | Kuan | G11B 33/128 |
| 10,499,531 B2 * | 12/2019 | Schmidt | G06F 1/28 |
| 10,798,844 B2 * | 10/2020 | Lee | H05K 5/0221 |
| D952,551 S * | 5/2022 | Chen | D13/103 |
| 2003/0193782 A1 | 10/2003 | Chen | G06F 1/188 |
| | | | 361/679.02 |
| 2004/0120123 A1 * | 6/2004 | Mayer | H05K 7/1489 |
| | | | 361/725 |
| 2004/0164208 A1 | 8/2004 | Nielson et al. | |
| 2005/0018387 A1 * | 1/2005 | Chou | G06F 1/188 |
| | | | 361/679.02 |
| 2005/0072745 A1 | 4/2005 | Schmidtk et al. | |
| 2005/0083651 A1 * | 4/2005 | Smith | H05K 7/20736 |
| | | | 361/679.48 |
| 2005/0088825 A1 * | 4/2005 | Miyamura | G06F 1/18 |
| | | | 361/715 |
| 2005/0281014 A1 * | 12/2005 | Carullo | H05K 7/1461 |
| | | | 361/796 |
| 2006/0152908 A1 * | 7/2006 | Berstis | G06F 1/26 |
| | | | 361/725 |
| 2006/0201404 A1 | 9/2006 | Schluter et al. | |
| 2007/0053169 A1 * | 3/2007 | Carlson | G11B 33/12 |
| 2007/0115627 A1 * | 5/2007 | Carlisi | G06F 1/183 |
| | | | 361/679.01 |
| 2007/0121283 A1 * | 5/2007 | Lai | G06F 1/183 |
| | | | 361/679.02 |
| 2008/0030962 A1 * | 2/2008 | Kunkle | H05K 7/1457 |
| | | | 361/726 |
| 2008/0137280 A1 * | 6/2008 | Chen | G06F 1/188 |
| | | | 361/726 |
| 2009/0034181 A1 * | 2/2009 | Gizycki | H01R 13/652 |
| | | | 361/822 |
| 2009/0097200 A1 * | 4/2009 | Sharma | G06F 1/183 |
| | | | 361/752 |
| 2009/0231803 A1 * | 9/2009 | Chang | H05K 7/1487 |
| | | | 361/688 |
| 2010/0020475 A1 | 1/2010 | Spitaels et al. | |
| 2010/0227493 A1 * | 9/2010 | Guy | H01R 31/06 |
| | | | 439/345 |
| 2010/0284141 A1 * | 11/2010 | Baitz | G06F 1/188 |
| | | | 361/679.01 |
| 2011/0043986 A1 * | 2/2011 | Conn | H05K 7/1492 |
| | | | 361/679.02 |
| 2015/0334865 A1 * | 11/2015 | Kuwabara | H05K 5/0217 |
| | | | 361/726 |
| 2016/0262283 A1 * | 9/2016 | Phillips | G06F 1/181 |
| 2016/0302329 A1 * | 10/2016 | Kang | H05K 7/20554 |
| 2016/0363966 A1 * | 12/2016 | Davis | G11B 33/128 |
| 2019/0008066 A1 | 1/2019 | Gupta et al. | |
| 2019/0215981 A1 * | 7/2019 | Chen | G06F 1/181 |

OTHER PUBLICATIONS

NVent Hoffman, ACCESSLUSTM II, 2018 Hoffman Enclosures Inc., pp. 1-12.

Notification of Transmittal of the International Search Report and the Written Opinion of the International Searching Authority from corresponding PCT/US2021/017474 dated Jun. 21, 2021.

* cited by examiner

BASE ELECTRICAL MODULE FOR MODULAR DATA CENTER

CROSS-REFERENCE TO RELATED APPLICATION

This application claims the benefit under 35 U.S.C. § 119(e) of U.S. Provisional Patent Application No. 62/975,030 titled BASE ELECTRICAL MODULE FOR EQUIPMENT RACK ASSEMBLY filed on Feb. 11, 2020, which is herein incorporated by reference in its entirety for all purposes.

BACKGROUND OF DISCLOSURE

1. Field of Disclosure

Aspects of the present disclosure relate generally to data centers, including microdata centers, small rooms and closets, that contain racks and enclosures used to house data processing, power, networking and telecommunications equipment.

2. Discussion of Related Art

Equipment enclosures or racks for housing electronic equipment, such as data processing, power, networking and telecommunications equipment have been used for many years. Such racks are used to contain and to arrange the equipment in small wiring closets, microdata centers, small rooms, as well as equipment rooms and large data centers. An equipment rack can be an open configuration and can be housed within a rack enclosure, although the enclosure may be included when referring to a rack.

Hangable information technology ("IT") racks are known in the industry. Presently, hangable IT racks are assembled onsite, i.e., at the user's final location, and if an electrician is needed to hard-wire the microdata center, the electrician may be forced to address pre-installed IT equipment that is in the way.

SUMMARY OF DISCLOSURE

Embodiments of the present disclosure are directed to a base electrical module, sometimes referred to herein as an "edge module" that can we wired by the electrician and hung on the wall prior mounting to other information technology ("IT") equipment. The work to be performed by the electrician is completed as soon as wiring is routed to the edge module. At that point, mounting racks can be assembled anywhere, e.g., offsite, by placing IT equipment into the rack, adding optional cooling on top, etc. Finally, the assembled IT equipment rack can be delivered to a final location and simply attached to the previously-mounted edge module. The edge module exposes standard power plugs to the user, so no electrician is needed to route wiring to the IT equipment. In some embodiments, multiple edge modules may be stacked, e.g., if an uninterruptible power supply ("UPS") is built into the edge module, and multiple edge modules may be used to provide sufficient backup power to the IT equipment.

One aspect of the present disclosure is directed to a modular data center comprising a base electrical module including a casing, a controller supported by the casing, and a power distribution unit coupled to the controller, and an equipment rack including a frame coupled to the base electrical module, the frame of the equipment rack being configured to receive electronic equipment. The electronic equipment receives power from the base electrical module. The base electrical module is external to the equipment rack.

Embodiments of the modular data center further may include the base electrical module further having a support configured to be secured to the casing. The support may be configured to be hingedly connected to the frame of the equipment rack. The base electrical module further may include an additional power distribution unit. The base electrical module further may include one or more hardwire connections. The base electrical module further may include an accommodation or feature for a module to be attached. The base electrical module further may include one or more power distribution unit connections. The base electrical module further may include an uninterruptible power supply ("UPS"). The base electrical module further may be configured to bypass the UPS, while keeping power applied to the PDU during UPS service. The base electrical module further may include a management and security module. The base electrical module further may include a user interface coupled to the management and security module. The management and security module may be coupled to the controller and the power distribution unit to provide control to the power distribution unit. The modular data center further may include a UPS module including at least one backup UPS. The modular data center further may include a cover configured to enclose the base electrical module and the equipment rack. The modular data center further may include a cooling module to provide cooling and/or heating to the equipment rack. The modular data center further may include a filter and fan module in fluid communication with the cooling module. The equipment rack further may be configured to receive at least one of the cooling module or the filter and fan module. The modular data center further may include a cover configured to enclose the base electrical module, the equipment rack, and at least one of the cooling module or the filter and fan module. The modular data center of claim 1, wherein the equipment rack is further configured to receive hot-swappable electronic equipment.

Another aspect of the present disclosure is directed to a method of assembling and installing a modular data center. In one embodiment, the method comprises: installing a base electrical module on a surface, the base electrical module including a casing, a controller supported by the casing, and a power distribution unit coupled to the controller; and hingedly connecting an equipment rack to the base electrical module, the equipment rack including a frame coupled to the base electrical module, the frame of the equipment rack being configured to receive electronic equipment. The electronic equipment receives power from the base electrical module. The base electrical module is external to the equipment rack.

Embodiments of the method further may include securing a UPS module to the base electrical module. The method further may include securing a cover to the base electrical module and the equipment rack. The method further may include providing a cooling module to provide cooling and/or heating to the equipment rack. The method further may include providing a filter and fan module in fluid communication with the cooling module. Installing the base electrical module may include securing a support to the casing of the base electrical module. The equipment rack may be configured to be hingedly connected to the support.

BRIEF DESCRIPTION OF DRAWINGS

Various aspects of at least one example are discussed below with reference to the accompanying figures, which are not intended to be drawn to scale. The figures are included to provide illustration and a further understanding of the various aspects and examples, and are incorporated in and constitute a part of this specification, but are not intended as a definition of the limits of the disclosure. In the figures, identical or nearly identical components illustrated in various figures may be represented by like numerals. For purposes of clarity, not every component may be labeled in every figure. In the drawings.

DETAILED DESCRIPTION

Figure 1:
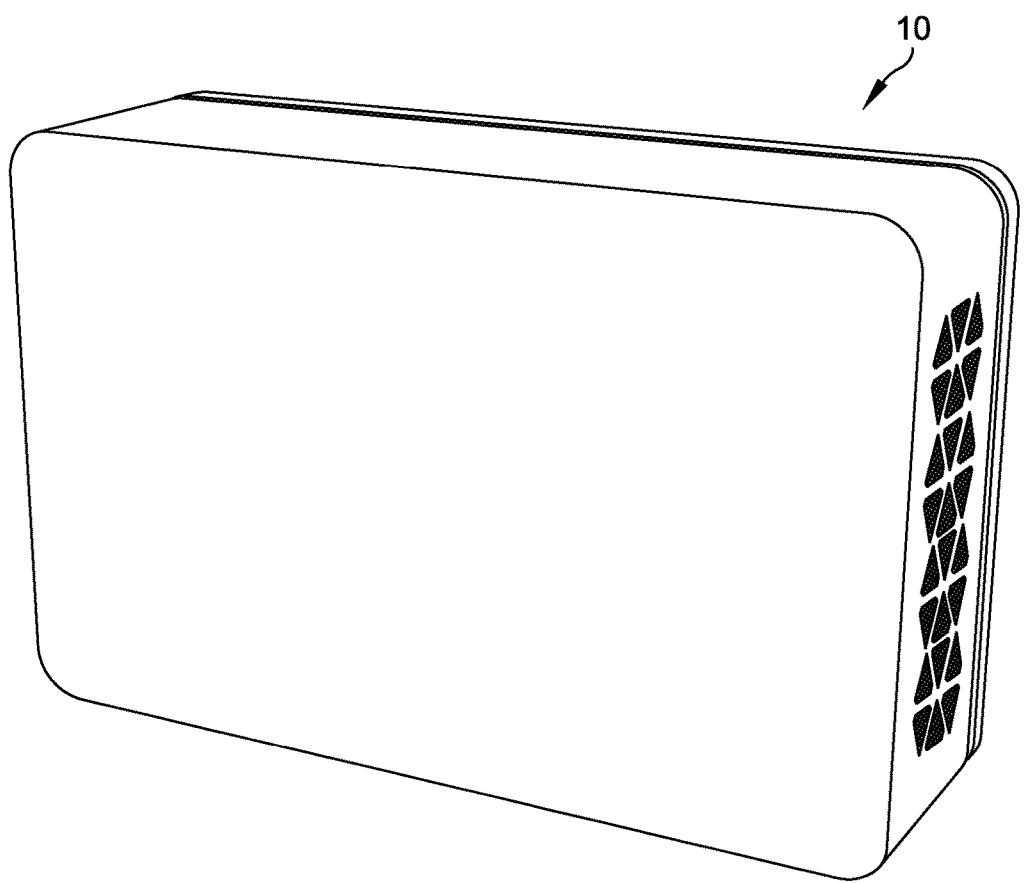
FIG. 1 is a perspective view of a modular data center of an embodiment of the present disclosure.

This disclosure is not limited in its application to the details of construction and the arrangement of components set forth in the following description or illustrated in the drawings. The principles set forth in this disclosure are capable of being provided in other embodiments and of being practiced or of being carried out in various ways. Also, the phraseology and terminology used herein is for the purpose of description and should not be regarded as limiting. The use of "including," "comprising," "having," "containing", "involving", and variations thereof herein, is meant to encompass the items listed thereafter and equivalents thereof as well as additional items.

All-in-one equipment racks may be used in microdata centers for edge application, which are typically deployed in closets or other locations without adequate cooling resources. These applications use racks sealed from the surrounding ambient air for physical security and environment protection. The equipment racks require highly varied requirements, including but not limited to environment, serviceability, security, and management.

As used herein, "enclosures" and "racks" are used to describe apparatus designed to support electronic equipment.

The present disclosure is directed to a micro data solution partitioned by integration capability and field install and/or service skill. Pre-assembled and integrated modules can be drop-shipped to site coordinated with availability of skills on site, avoiding uninstalled equipment or modules from getting lost or damaged on construction site. Allowing requisite field skills to show up on their available time rather than having them on site at same time or at inopportune times.

In some embodiments, a base electrical module can be installed by an electrician. The base electrical module can be configured to include plug-in outlets and connectors for other modules, allowing work to be performed by the electrician to be done at the base level.

In some embodiments, a cooling module connects and attaches to the base electrical module and can be installed and serviced by a cooling specialist. As used herein, a cooling module is a module that provides cooling and/or heating to the modular data center.

In some embodiments, an information technology ("IT") module assembly can be pre-assembled and pre-integrated as a completed module, and then attached to pre-installed electrical, cooling assemblies. IT equipment can be further partitioned, e.g., analytics IT and local connectivity solutions, as separate modules integrated and installed by their respective skills.

In some embodiments, a base bracket is provided to contain a maintenance bypass thereby allowing removal of any module while still maintaining utility power to other modules.

In some embodiments, a wall mounted base electrical module has horizontally or vertically mounted IT equipment. However, the equipment can be applied to other configurations, such as floor mount and built-in installations.

In some embodiments, the base electrical module can be configured to facilitate final system integration, such as a flexible management system, diagnostics, advanced assistance, and asset management configuration.

In some embodiments, a modular data center including a base electrical module of embodiments of the present disclosure can be configured to include the following features:

1. The electrical base electrical module can be pre-installed by an electrician.
2. Separate IT modules, including connectivity modules, can be integrated by specialist partners or technicians.
3. Modular cooling modules can be expanded in accordance with IT and connectivity needs.
4. The base electrical module can be configured to achieve flexible mounting orientations, e.g., vertical, horizontal, wall, and floor.
5. The modular data center includes a hinged embodiment to allow access, service, and modular replacement without having to disassemble the assembly.
6. The modular data center includes a stackable embodiment to allow low-cost modular product.

Modular Data Center

A micro data center ("MDC") typically has the following components integrated in a half-rack or full-rack solution. With a 6-U vertical compact MDC solution, one or more components may be utilized.

In some embodiments, the modular data center may include an equipment rack with levels of environmental protection from indoor rated to extreme conditions.

In some embodiments, the modular data center may include cooling, which may embody fans, precision cooling, or liquid cooling.

In some embodiments, the modular data center may include a means of providing quality power, including an uninterruptible power supply ("UPS") and/or a battery, a service bypass, and a power distribution unit ("PDU") with sufficient outlets for all loads. The power system may also have second redundant power connection for critical applications.

In some embodiments, the modular data center may include space for IT and connectivity equipment, which are often serviceable by rack rail access.

In some embodiments, the modular data center may include system management either on-site, remote, or cloud-based. The system management may involve equipment and environmental sensors, edge monitoring control of the system, and higher-level analytics allowing economical and reliable continuation of business mission.

With the components identified herein, a particular solution is often integrated in its entirety at one place.

Embodiments of the modular data center described herein break up the functions into discrete modules, optimized for low cost, variable modular growth, and service access.

Base Electrical Module

The base electrical module is configured to provide control and power to an IT equipment rack, with the base electrical module being external to the IT equipment rack. The base electrical module can include a variety of components, including but not limited to a PDU, an additional PDU, one or more hardwire connections, an accommodation or feature for a subsequent module to be attached, one or more power distribution unit connections, a UPS, a management and security module, and a user interface coupled to the management and security module.

In some embodiments, the base electrical module may include a mounting wall plate for wall mount applications.

In some embodiments, the base electrical module may include a service bypass module for applications requiring such function.

In some embodiments, the base electrical module may include one or more hardwire connections. Some applications may use a NEMA or IEC 30-amp plug or equivalent as needed.

In some embodiments, the base electrical module may include one or more PDU connection.

In some embodiments, the base electrical module may include a potential interconnect protocol (IP) connection pass-through.

In some embodiments, the base electrical module may include a display coupled to a controller to control the operation of the base electrical module.

In some embodiments, the base electrical module may include a video camera coupled to the display to provide video images to the operator.

In some embodiments, the base electrical module may include a single front sensor port provided in the display to support a temperature and/or humidity sensor at the front of the IT equipment rack or proximate an air inlet providing airflow through the IT equipment rack.

In some embodiments, the base electrical module may include one or more, e.g., four, sensor ports that are configured to support a variety of sensors. Such sensors may include a tachometer for a fan, a vibration sensor, an additional temperature and/or humidity sensor, and a leak detection sensor.

In some embodiments, the base electrical module may include a swipe-card lock mechanism that supports card swipe entry and a companion door contact switch. The swipe-card lock mechanism can be utilized to indicate sequence control as well as whether the module is in an open or closed status.

In some embodiments, the base electrical module may include a bypass mechanism that is provided in addition to or in place any bypass switch associated with the IT equipment rack. In one embodiment, the bypass mechanism can include a toggle switch that triggers relays to a source, e.g., the UPS or a utility power source.

In some embodiments, the base electrical module may include one or more power supply units ("PSU") that are used to power the components of the module, which are monitored to indicate whether the UPS output is on and/or the utility is providing power.

In some embodiments, the base electrical module provides a single point of access with a facility network to the display.

In some embodiments, the display of the base electrical module may be a color display that includes a menu, a status, and control of the module, one or more pushbuttons for navigations, and status indicators/lights.

Such a base electrical module can be made at a facility that makes code approved distribution panels, and similar mounted electrical equipment. The base electrical module can be the initial module installed, where hardwire connection requires an electrician, whose time is needed only for this module connection. Other modules can be safety connected to the base electrical module by regular personnel.

UPS Module

The UPS module can be provided in addition to the base electrical module. In one embodiment, the UPS module contains an alternating current ("AC") power back-up and battery, or reliable direct current ("DC") power for applications that require direct current.

In some embodiments, the UPS module can be combined with the above base electrical module and/or with the PDU connections.

In some embodiments, the UPS module can be connected, disconnected, or replaced by a person skilled in the art of managing IT equipment. This UPS module can be easily configured and integrated at a domestic or an international facility. The UPS modules can be configured with components manufactured by various entities at partner module integration sites. When the UPS module is paired with a base electrical module having a service bypass function, the UPS module can be serviced, upgraded, and/or swapped without service interruption of the key IT or connectivity modules.

In some embodiments, the UPS can be used to control power within the modular data center and monitor certain aspects of the modular data center including providing power readings, outlet switching. In one embodiment, the information can be communicated to an operator by an integrated network to a display, which can also function as a management controller.

Preconfigured IT Equipment Rack Module

A preconfigured IT equipment rack module may include IT equipment that normally takes up some U-space in a conventional equipment rack. Using supporting infrastructure, any number of integrators can install and test an IT configuration to a standard test connection and then ship to the site when the site is ready to attach and commission the MDC. The preconfigured IT equipment rack module can be configured to attach to the UPS module by hinges, couplings, fittings, hardware, or other means depending on the specific embodiment.

The preconfigured IT equipment rack module may be configured to include an attachment enclosure and a myriad of IT equipment that is often not rack-mounted, such as telephone, routers, security systems, and the like. Such a system can be integrated by building control specialists often with different skills than your normal IT system integration outfit. Likewise, the preconfigured connectivity module can be configured to attach to the module before it by means similar to that described above, often in a consistent attachment method throughout the MDC to allow future insertion or addition or subtraction of MDC modules as business needs, upgrades, and conditions require.

Cover/Shroud

A cover or shroud can be provided to cover the base electrical module and the equipment rack module, and the UPS module when provided. The cover or shroud is provided to improve airflow within the assembly, and to provide security from accessing the module housed within the assembly.

In some embodiments, the cover can be sized and shaped to match the sizes and shapes of the components that it covers. Moreover, the cover can be configured to optimize the ingress protection (IP) rating of the cover to accommodate different environments and/or cooling/airflow requirements.

Cooling Module

A cooling module may be configured to be a stackable and a scalable arrangement that allows cooling and/or heating air and/or fluid to access all modules from a common surface(s). As referenced above, the cooling module can be configured to provide cooling and/or heating to the modular data center.

In some embodiments, a cooling fan may be provided to move air from one common surface of the MDC through the interior of each module and out the opposite or alternate surface, other modular cooling options are possible.

In some embodiments, precision air-cooling can be wrapped around each module to allow effective use of MDC in more extreme environments or demanding operating conditions. Likewise, liquid cooling modularity can be utilized by having a stackable or connectable manifold module with each MDC module.

In some embodiments, a filter and fan module may be provided to provide clean airflow within the assembly.

Illustrated Embodiments

Figure 2:
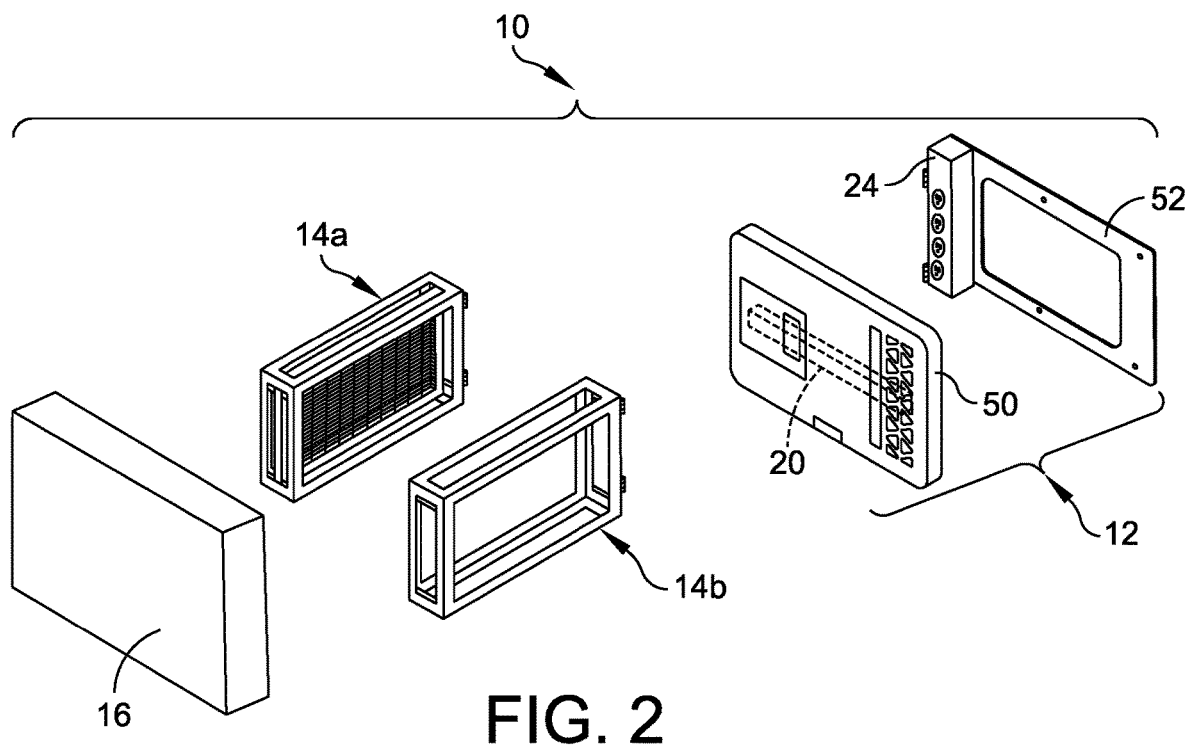
FIG. 2 is an exploded perspective view of the modular data center shown in FIG. 1.

Referring to the drawings, and specifically to FIGS. 1 and 2, a modular data center is generally indicated at 10. As shown in FIG. 2, the modular data center 10 includes an edge or base electrical module generally indicated at 12 of an embodiment of the present disclosure. As will be described in greater detail below, the base electrical module 12 includes a casing 50 and a support arm 52, the purpose of which will be described in detail below. The base electrical module 12 further includes several design features, including but not limited to a controller 20, a smart PDU, such as PDU 24, an additional PDU, management and security module having ports, and other mechanical features. The modular data center 10 further includes an IT equipment rack, which can be hingedly secured to the support 52 of the base electrical module 12. FIG. 2 illustrates one IT equipment rack, generally indicated at 14a, which includes a wire grid that can mount non-traditional equipment, such as switches. The IT equipment rack 14a is configured to support IT equipment, such as servers. FIG. 2 further illustrates another IT equipment rack, generally indicated at 14b, which is a frame that is empty to receive IT equipment, such as servers. As used herein, the IT equipment rack may be referred to as IT equipment rack 14. In addition to servers and other types of IT equipment, the IT equipment rack 14 can be configured to house a variety of IT equipment that is often not rack-mounted, such as telephone, routers, security systems, and the like. The modular data center 10 further includes a cover or shroud 16, which is sized to enclose the assembled base electrical module 12 and the IT equipment rack 14. The cover 16 provides security to the base electrical module 12 and the IT equipment housed by the IT equipment rack 14. The cover 16 further provides controlled air flow through the center.

Figure 3:
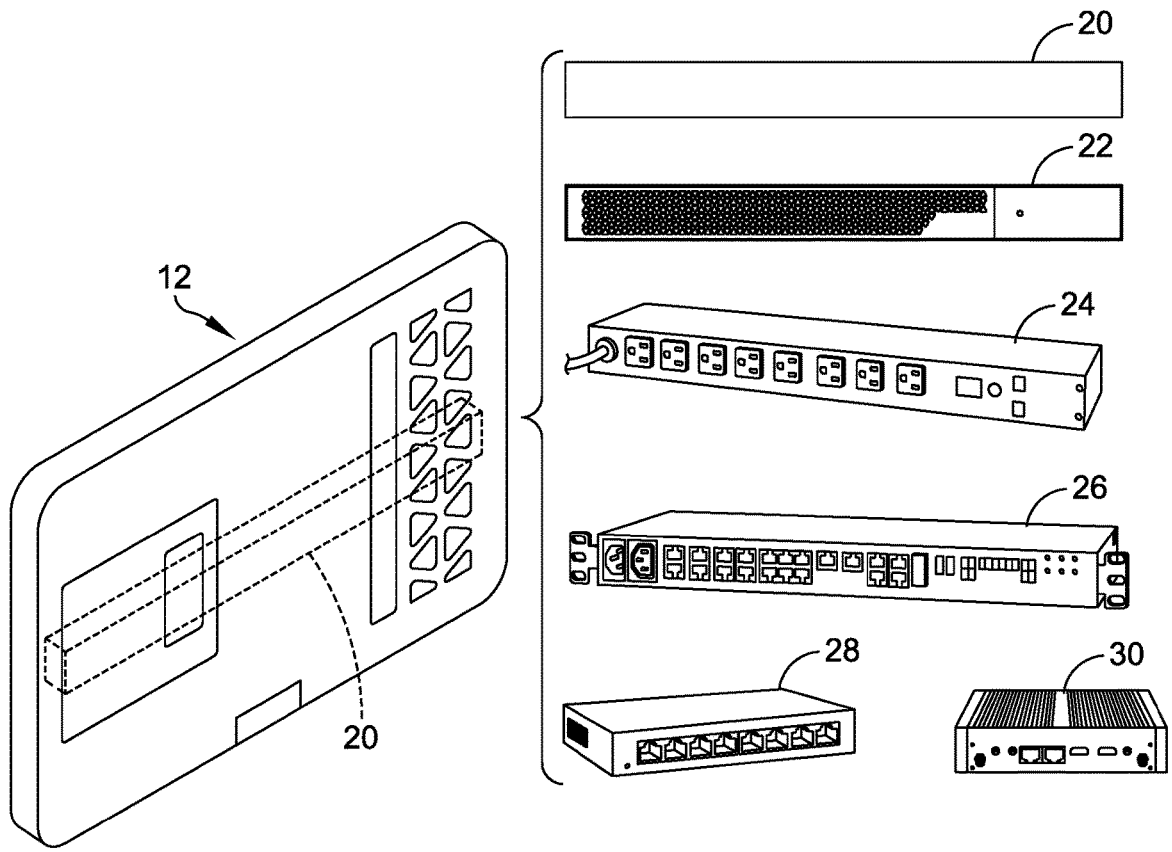
FIG. 3 is a perspective schematic view of the base electrical module, including exemplary components of the base electrical module.

Referring to FIG. 3, the base electrical module 12 can be configured to include several components. As mentioned above, the base electrical module is configured to include the controller 20 and the PDU 24, which are coupled or otherwise connected and communicate with one another. In one embodiment, the base electrical module 12 further can be configured to include a UPS 22, a physical security unit 26, and management equipment, including a switch unit 28 and a gateway unit 30. As will be discussed in greater detail below, the base electrical module 12 further can include a monitor to provide physical security to the modular data center. The controller 20 is coupled to the PDU 24 and the UPS 22 and is configured to control power from the base electrical module 12 to the equipment housed within the IT equipment rack 14 via the PDU 24 and/or the UPS 22. In one embodiment, the switch unit 28 can be a transfer switch. In one embodiment, the gateway unit 30 is a hardware device that functions as a gate between networks. The gateway unit 30 may embody a router, firewall, server, or other device that enables traffic to flow in and out of the network. It should be understood that these functions, as well as any other function of the base electrical module 12 can be configured and implemented in a variety of ways, and not necessarily pursuant to the embodiments disclosed and described herein.

Figure 4:
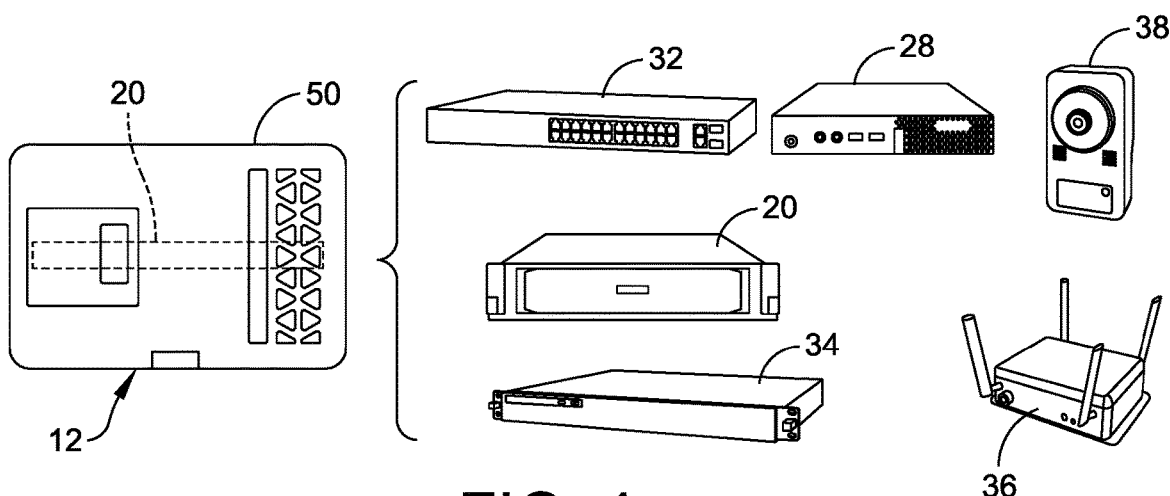
FIG. 4 is a perspective schematic view of the base electrical module, further including additional exemplary components of the base electrical module.

Referring additionally to FIG. 4, the base electrical module 12 further may be configured to include a networking unit 32, an integration unit 34, a communications unit 36 and a camera 38, which, in one embodiment, may be a Netbotz® Camera Pod 165 offered by American Power Conversion of West Kingston, R.I. The base electrical module 12 can include any type of appliance that is used to operate with equipment housed within the IT equipment rack 14. The controller 20 is coupled to these devices to provide operational control to the devices.

Figure 5:
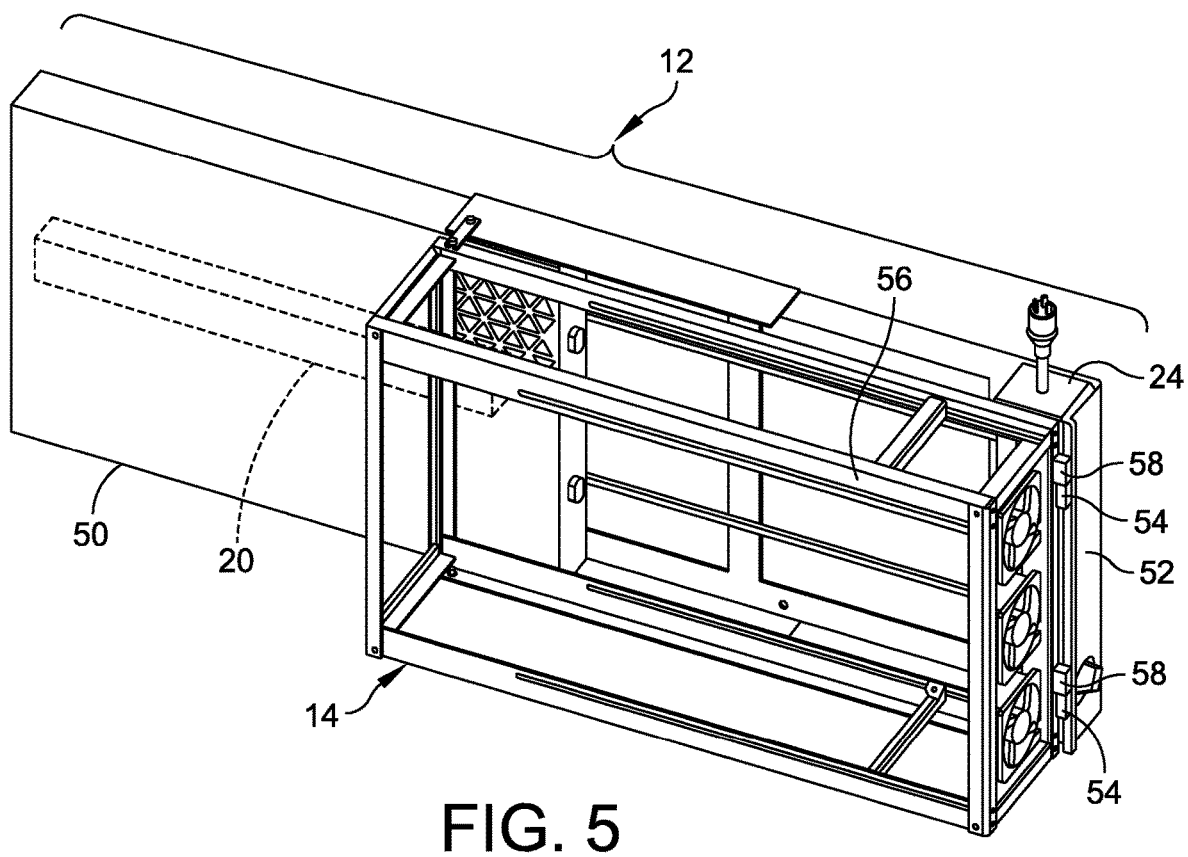
FIG. 5 is a perspective view illustrating an IT equipment rack of the modular data center hingedly connected to the base electrical module, with the base electrical module being installed within a sub-base module or support.

Referring additionally to FIG. 5, the base electrical module 12 includes the casing 50, which used to support the components of the base electrical module, e.g., the controller 20, the UPS 22, the PDU 24, and other components. The base electrical module 12 further includes the support structure 52, which is configured to receive and support the casing 50. In one embodiment, the support structure 52 is a frame structure fabricated from a strong metal or metal alloy. The support structure 52 includes hinge elements, each indicated at 56, to hingedly secure the base electrical module 12 to the IT equipment rack 14. As shown, the support structure 52 can be configured to include the PDU 24, which may be in addition to or in place of the PDU 24 associated with the casing. In FIG. 5, the casing 50 is illustrated being inserted into the support structure 52, thereby enabling the casing to be easily replaced from a side of the modular data center 10 without disrupting power to a load.

In some embodiments, the casing 50 of the base electrical module 12 is configured to be hot-swappable on the support structure 52 to enable replacement of the casing with another casing having the same or different functionality.

The IT equipment rack 14 includes a frame structure 56 that is configured to receive IT equipment. As shown, the frame structure 56 of the IT equipment rack 14 includes hinge elements, each indicated at 58, that mate with the hinge elements 54 of the support structure 52 to hingedly secure the IT equipment rack to the support structure 52 of the base electrical module 12. It should be understood that any type of hinge may be provided to secure the frame structure 56 of the IT equipment rack 14 to the support structure 52 of the base electrical module 12. As clearly shown, the base electrical module is external to the IT equipment rack 14, with the electrical equipment housed by the IT equipment rack being controlled and powered by the base electrical module.

In some embodiments, the frame structure 56 of the IT equipment rack 14 is configured to receive hot-swappable electronic equipment, such as servers.

In some embodiments, the cover 16, when secured to the fully assembled base electrical module 12 and the IT equipment rack 14, is configured to be locked to and unlocked from the center.

In some embodiments, the base electrical module 12 is configured with a switch, e.g., switch unit 28 or a rotary or toggle switch, to bypass the UPS, keeping power applied to the PDU 24 during UPS service.

In some embodiments, the casing 50 can be removed from the support structure 52 by sliding the casing from the support structure several inches to disengage the components of the casing from the electrical components housed by the IT equipment rack 14, and removed forward. A new or replacement casing 50 can be installed in a similar manner.

Figure 6:
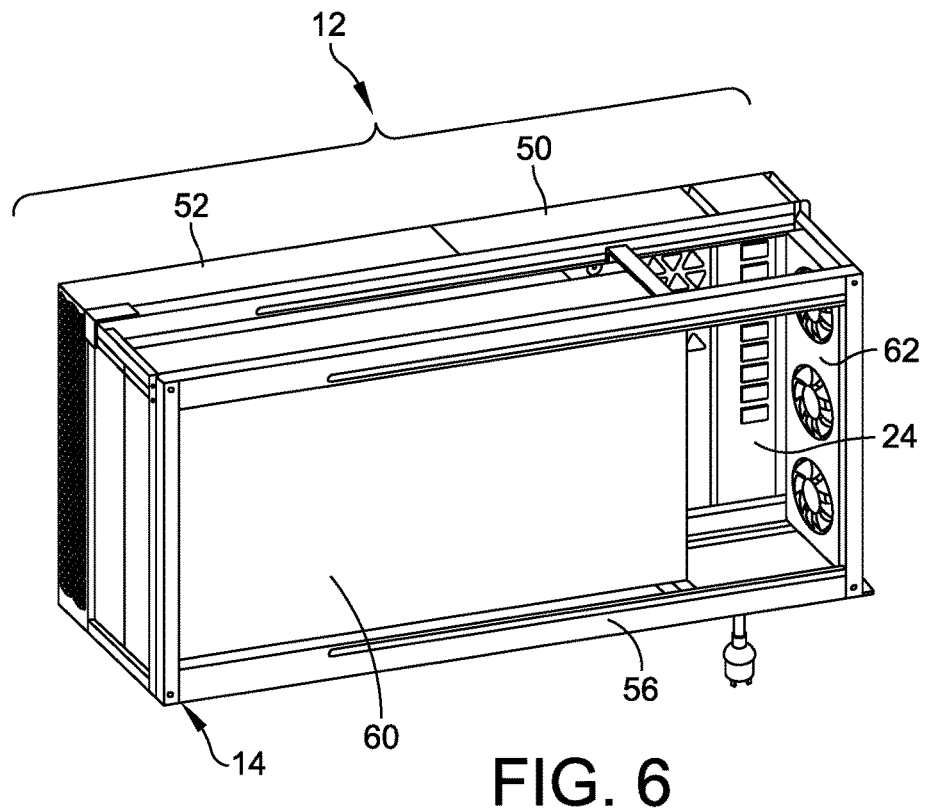
FIGS. 6 and 7 are perspective views illustrating IT equipment being installed in the IT equipment rack.
Figure 7:
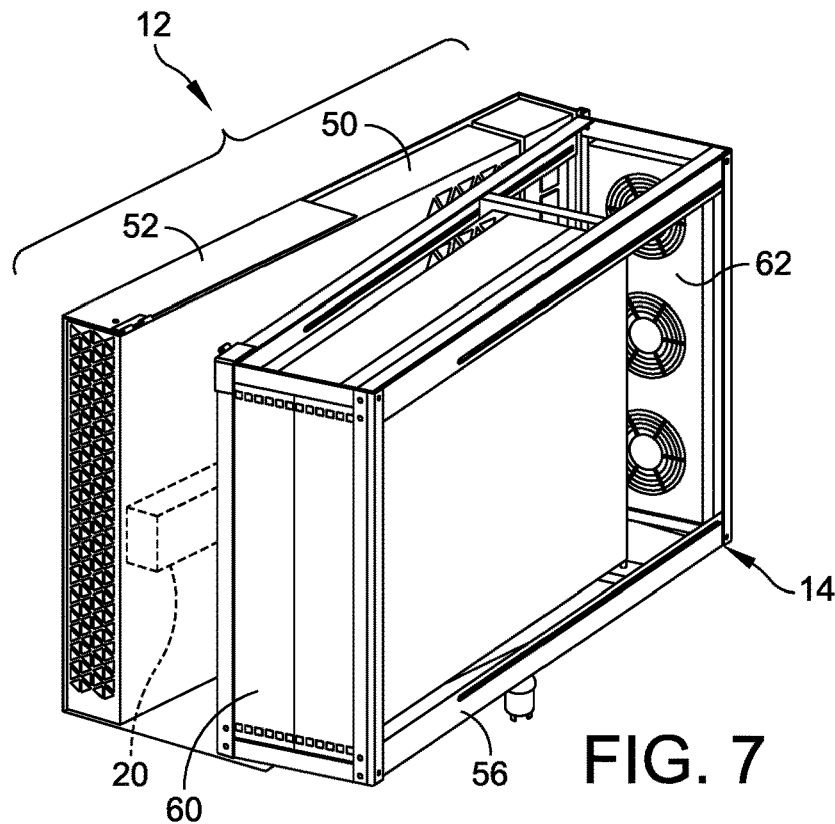

Referring to FIGS. 6 and 7, the IT equipment rack can be configured to receive one or more pieces of electronic equipment, e.g., servers. The IT equipment rack can be configured to achieve variable U-space distances, e.g., 4-6 U. In one embodiment, the IT equipment rack can be configured as a 19-inch rack having 21-inch rails.

As shown in FIG. 7, the frame structure 56 of the IT equipment rack 14 can be configured to support electronic equipment 60, such as two servers. The IT equipment rack 14 further can be configured with a cooling module, e.g., a fan unit 62, that is mounted on one end of the frame structure 56. The arrangement is such that the fan unit 62 draws air into IT equipment rack 14 to cool the electronic equipment 60 housed by the IT equipment rack. In one embodiment, the fan unit 62 includes a tray that houses a number of fans, e.g., three, to draw air into the IT equipment rack 14. It should be understood that the cooling module can further include a liquid cooling system to cool the electronic equipment.

Figure 8:
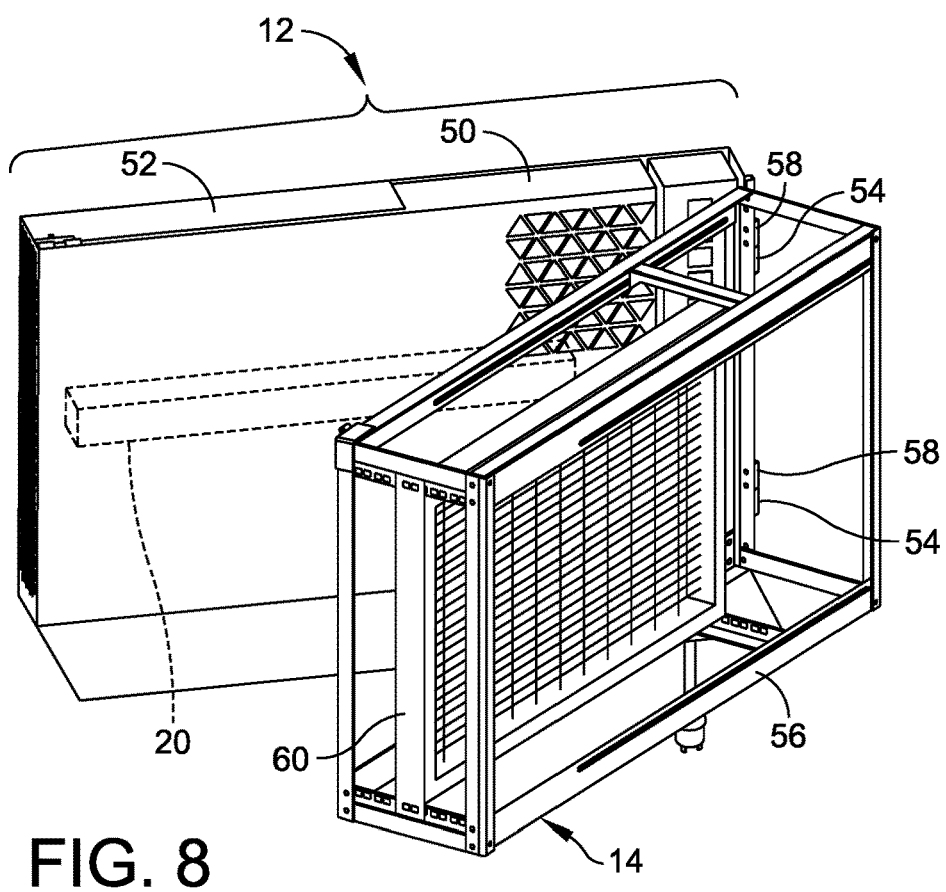
FIG. 8 is a perspective view of the IT equipment rack and the base electrical module.

Referring to FIG. 8, the manner in which the IT equipment rack 14 is hingedly secured to the base electrical module 12 enables double sided access to the frame structure 56 of the IT equipment rack to optimize space. Further, the IT equipment rack 14 can be configured to support different equipment 60, such as a single, narrower server.

Figure 9A:
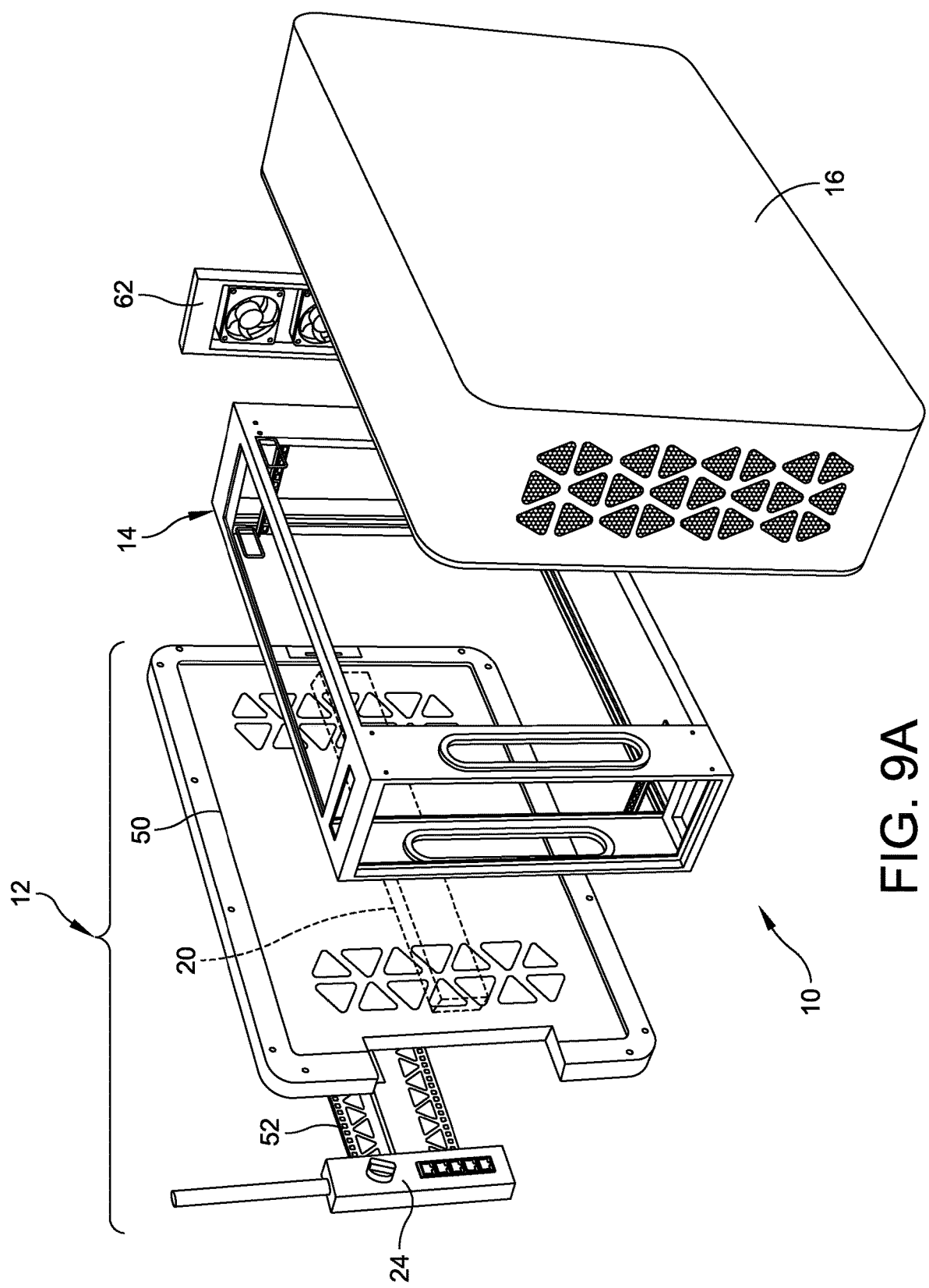
FIG. 9A is an exploded perspective view of the modular data center.
Figure 9B:
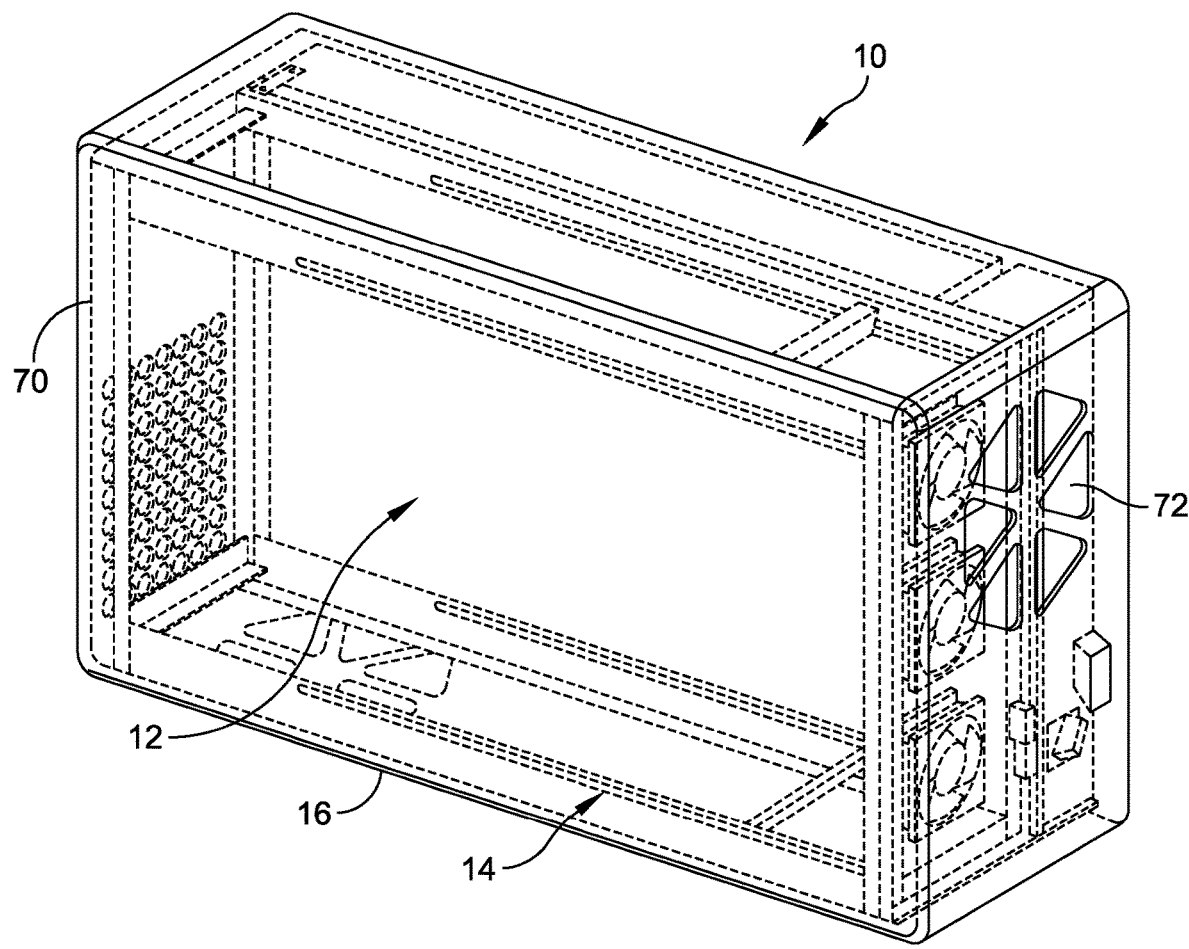
FIG. 9B is a perspective view of the modular data center showing features thereof.

Referring to FIGS. 9A and 9B, the cover 16 is configured to slip on the assembled base electrical module 12 and the IT equipment rack 14 to provide a sealed assembly. The cover 16 can be configured with inlets 70 and outlets 72 that can be configured to include baffles and/or filters to control airflow through the modular data center 10. As mentioned above, the cover 16 can be sized to cover and slip on to the assembled base electrical module 12 and the IT equipment rack 14.

Further, the modular data center 10 optionally may include a backup UPS, an active cooling module and/or a filter and fan module. In some embodiments, the backup UPS is provided in place the UPS 22 associated with the base electrical module 12 so that the backup UPS functions as the only UPS of the modular data center 10. In some embodiments, the active cooling module can be positioned on a side of the IT equipment rack 14 to provide direct cooling to the IT equipment 60 housed within the IT equipment rack. The filter and fan module can be positioned adjacent the active cooling module to provide airflow to the active cooling module. The operation of the modular data center can be controlled by a computer system, such as controller 20, which will be described in greater detail below.

In some embodiments, the IT equipment and the modules described herein are components that can be configured to be hot-swappable.

Figure 10:
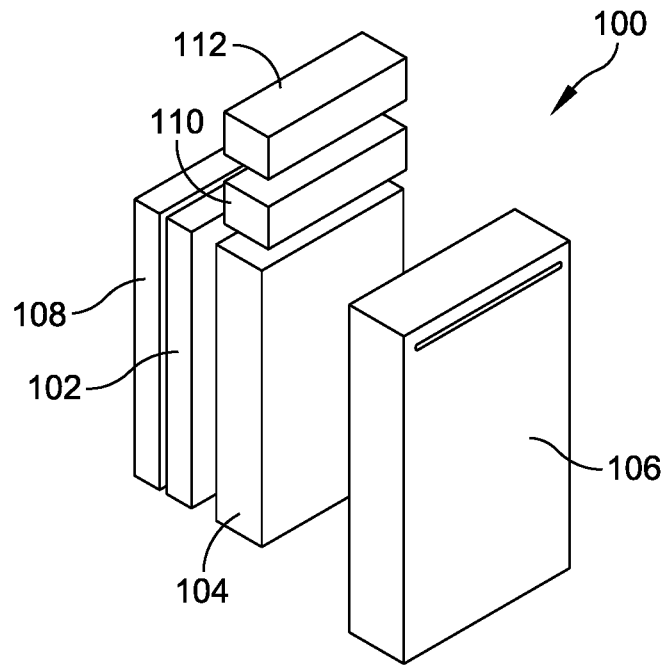
FIG. 10 is an exploded perspective schematic view of a modular data center of another embodiment of the present disclosure including an edge or base electrical module.

Referring to FIG. 10, a modular data center is generally indicated at 100. As shown, the modular data center 100 includes an edge or base electrical module 102 of an embodiment of the present disclosure. As with modular data center 12, the base electrical module 102 includes several design features, including but not limited to management and security module having ports, smart PDU, an additional PDU, and other mechanical features. The modular data center 100 further includes an IT equipment rack 104, which can be hingedly secured to the base electrical module 102. The IT equipment rack 104 can be configured to house a variety of IT equipment, including servers, as well as equipment that is often not rack-mounted, such as telephone, routers, security systems, and the like. The modular data center 100 further includes a cover or shroud 106, which is sized to enclose the assembled base electrical module 102 and the IT equipment rack 104. The cover 106 provides security to the base electrical module 102 and the IT equipment housed by the IT equipment rack 104. The cover 106 further provides controlled air flow through the system.

Further, the modular data center 100 optionally may include a backup UPS 108, an active cooling module 110 and/or a filter and fan module 112. In some embodiments, the backup UPS 108 is provided in place the UPS associated with the base electrical module 102 so that the backup UPS functions as the only UPS of the modular data center 100. As shown, the active cooling module 110 can be positioned on top of the IT equipment rack 104 to provide direct cooling and/or heating to the IT equipment housed within the IT equipment rack. The filter and fan module 112 can be positioned on top of the active cooling module 110 to provide airflow to the active cooling module. The operation of the modular data center 100 can be controlled by a computer system, such as controller 20 associated with modular data center 10, which will be described in greater detail below.

Figure 11:
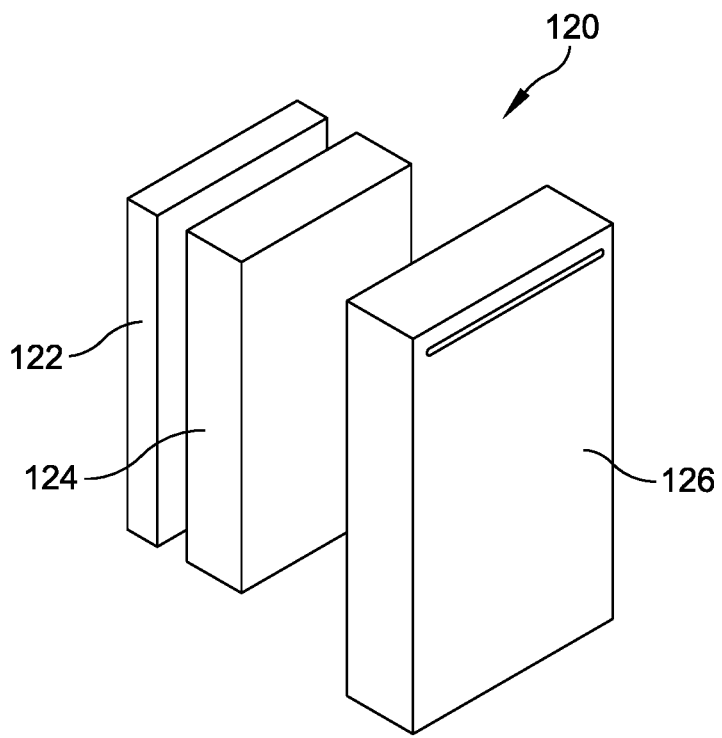
FIG. 11 is an exploded perspective schematic view of a modular data center including a base electrical module of another embodiment of the present disclosure.

Referring to FIG. 11, a modular data center of another embodiment is generally indicated at 120. As shown, the modular data center 120 includes a base electrical module 122 and an IT equipment rack 124, which, as with modular data center 10, can be hingedly secured to the base electrical module 122. The modular data center 120 further includes a cover 126, which is sized to enclose the assembled base electrical module 122 and the IT equipment rack 124.

Figure 12:
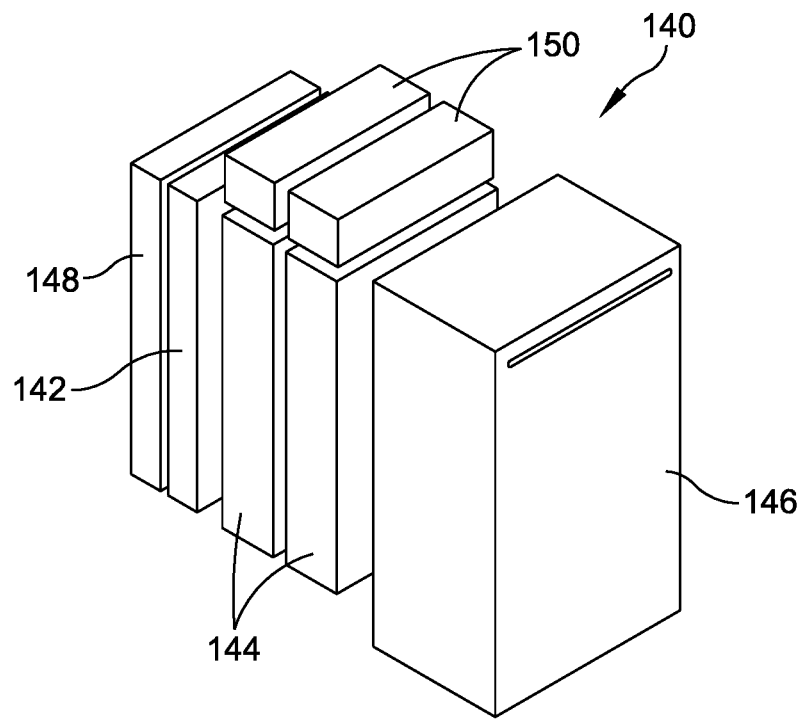
FIG. 12 is an exploded perspective schematic view of a modular data center including a base electrical module of another embodiment of the present disclosure.

Referring to FIG. 12, a modular data center of another embodiment is generally indicated at 140. As shown, the modular data center 140 includes a base electrical module 142 and two IT equipment rack, each indicated at 144, which together can be hingedly secured to the base electrical module. The provision of a second IT equipment rack 144 can provide redundancy to the modular data center 140. The modular data center 140 further includes a cover 146, which is sized to cover the assembled base electrical module 142 and the IT equipment racks 144. Cover 146 is deeper than cover 126 associated with modular data center 120. The modular data center 140 further includes a backup UPS 148 and two filter and fan modules, each indicated at 150, one for each IT equipment rack 144. In some embodiments, the backup UPS 148 is provided in place the UPS associated with the base electrical module 142 so that the backup UPS functions as the only UPS of the modular data center 140. As shown, each filter and fans module 150 can be positioned on top of its respective IT equipment rack 144 to provide airflow through the IT equipment racks.

Figure 13:
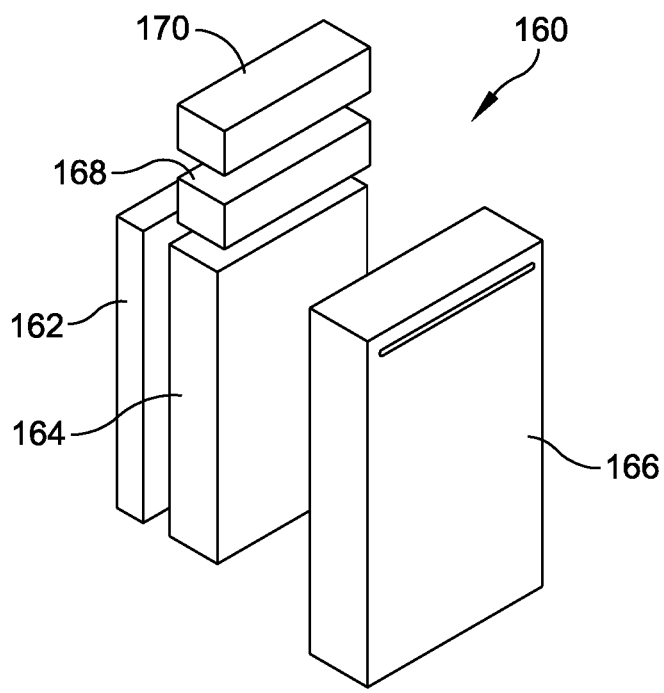
FIG. 13 is an exploded perspective schematic view of a modular data center including a base electrical module of another embodiment of the present disclosure.

Referring to FIG. 13, a modular data center of another embodiment is generally indicated at 160. As shown, the modular data center 160 is similar to the modular data center shown in FIG. 10 and includes a base electrical module 162, an IT equipment rack 164, a cover 166, an active cooling module 168 and a filter and fan module 170, but does not include the backup UPS.

Figure 14:
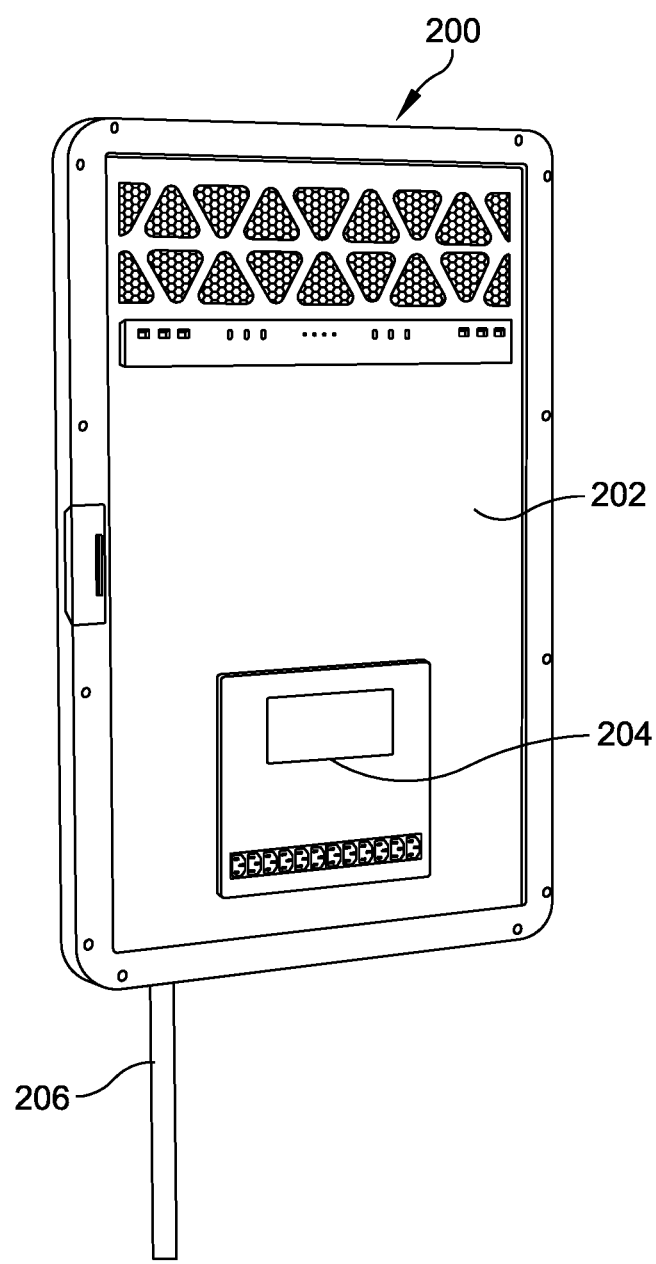
FIG. 14 is a perspective view of a base electrical module of an embodiment of the present disclosure.

Referring to FIG. 14, the base electrical module, generally indicated at 200, in one embodiment, includes a rectangular case or housing 202 to support the components of the module. The case 202 can be configured to a desired height, width and depth to accommodate components housed within the case. For example, the case can be horizontally oriented, as with base electrical module 12, or vertically oriented, as with base electrical module 200. In one embodiment, the case 202 can be fabricated from any suitable material, such as sheet metal or hard plastic. The case 202 is configured to be mounted on a wall (otherwise referred to as "panel mounted") by suitable fasteners or configured to rest on a horizontal surface. For wall mount applications, the case 202 includes a mounting wall plate that is configured to have openings to receive fasteners used to secure the base electrical module 202 to a wall.

As will be described in greater detail below, the base electrical module 200 includes a user interface 204 on a front side of the case 202. In one embodiment, the power and communication can be provided to the base electrical module 200 by a cable 206 secured to the case 202 along a bottom edge of the case. The cable 206 can be secured to any portion of the case 202 depending on the end use of the base electrical module 200. In one embodiment, the base electrical module 200 includes one or more hardware connections. The one or more hardwire connections may include a 30-amp plug or equivalent, that is connected to the cable 206. The one or more hardwire connections may include a terminal block.

Figure 15:
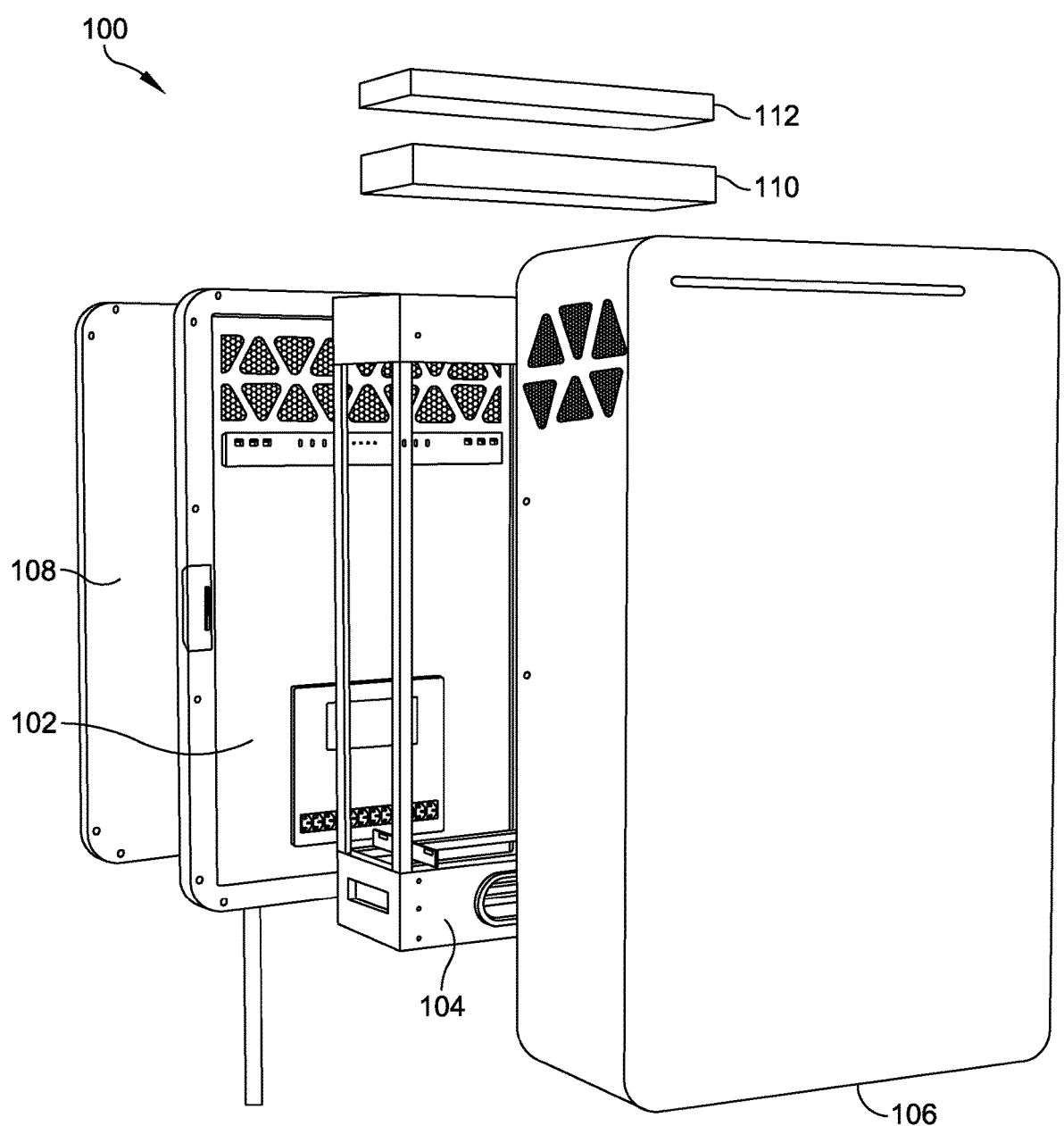
FIG. 15 is an exploded perspective view of the modular data center shown in FIG. 9.
Figure 16A:
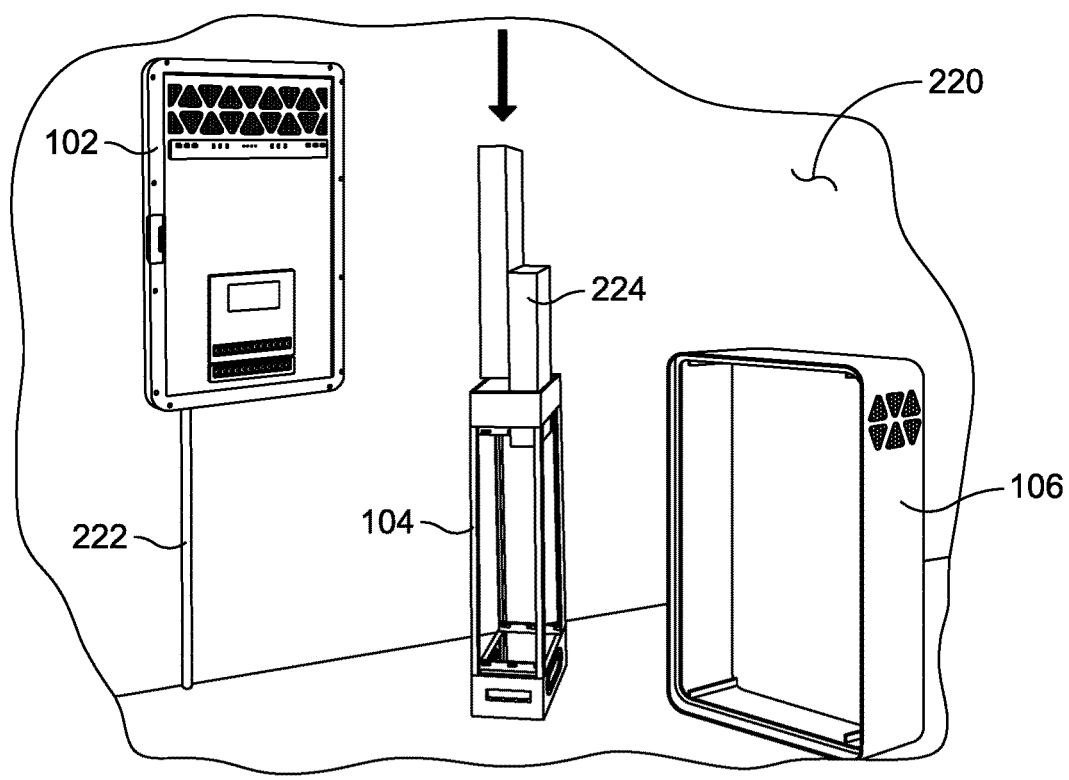
FIGS. 16A-16C are views illustrating an installation of a modular data center of an embodiment of the present disclosure.
Figure 16B:
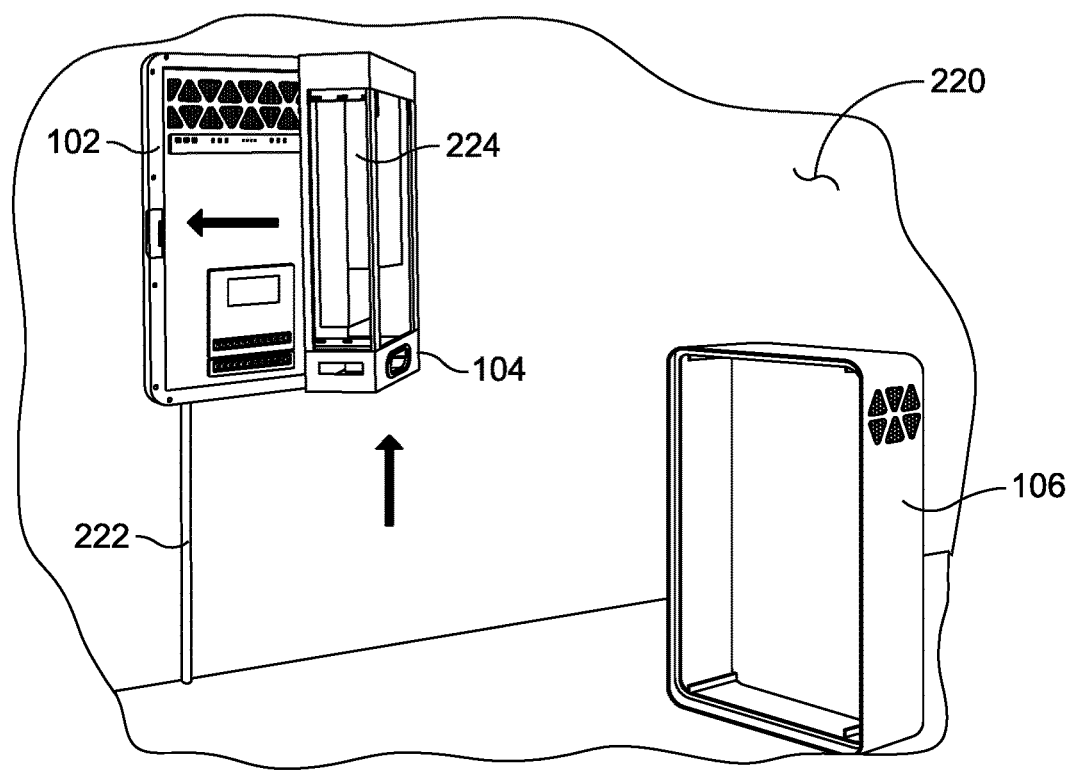
Figure 16C:
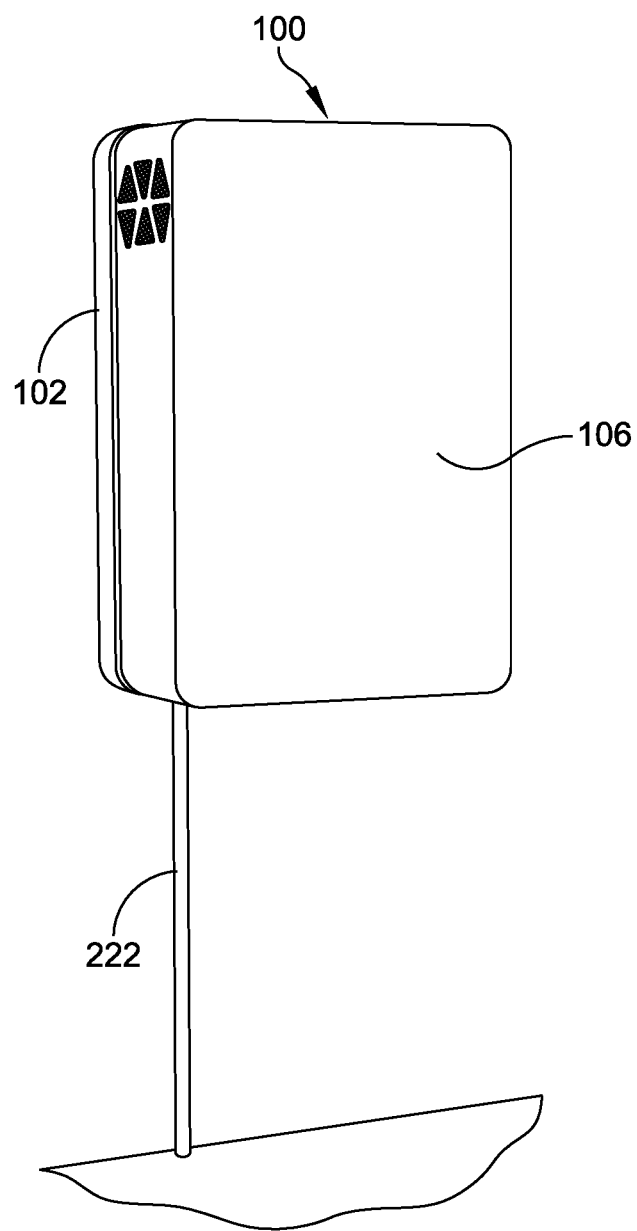

Referring to FIG. 15, in one embodiment, the architecture of a modular data center, such as modular data center 100, is illustrated prior to assembly, specifically a panel mounted configuration. As shown, the modular data center 100 includes the base electrical module 102, the IT equipment rack 104 (empty without electronic equipment), the cover 106, the backup UPS 108, the active cooling module 110 and the filter and fan module 112. Referring additionally to FIG. 16A-16C, the installation of the IT equipment assembly 100 is sequentially illustrated. In FIG. 16A, the base electrical module 102 is mounted on a wall 220 and wired with a cable 222 or a cord, such as a NEMA twistlock cord. Further, IT or electronic equipment 224 is installed within the IT equipment rack 104. As mentioned above, the IT equipment 224 can include servers, communication, network and related equipment. In FIG. 16B, the assembled IT equipment rack 104 is hingedly secured to the base electrical module 102 along respective long edges of the IT equipment rack and the base electrical module. As shown, the IT equipment rack 104 can be rotated about the hinge between an open position (or partially open position shown in FIG. 16B) and a closed position in which the IT equipment rack is coplanar with the base electrical module 102. The hinges that secure the IT equipment rack 104 to the base electrical module 102 can be provided on either long edges of the respective pieces of equipment. In FIG. 16C, the cover 106 of the modular data center 100 is installed on the base electrical module 102 and the IT equipment rack 104 when the IT equipment rack is in closed position.

Figure 17A:
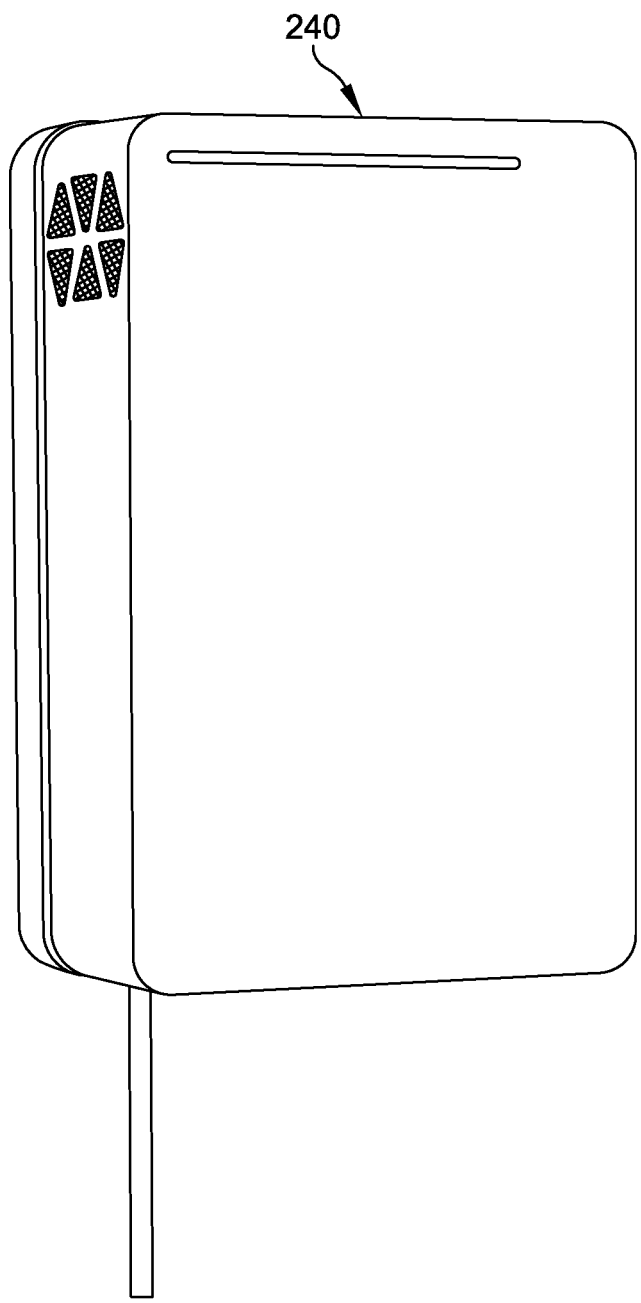
FIGS. 17A-17C are perspective views illustrating several embodiments of modular data centers of the present disclosure.
Figure 17B:
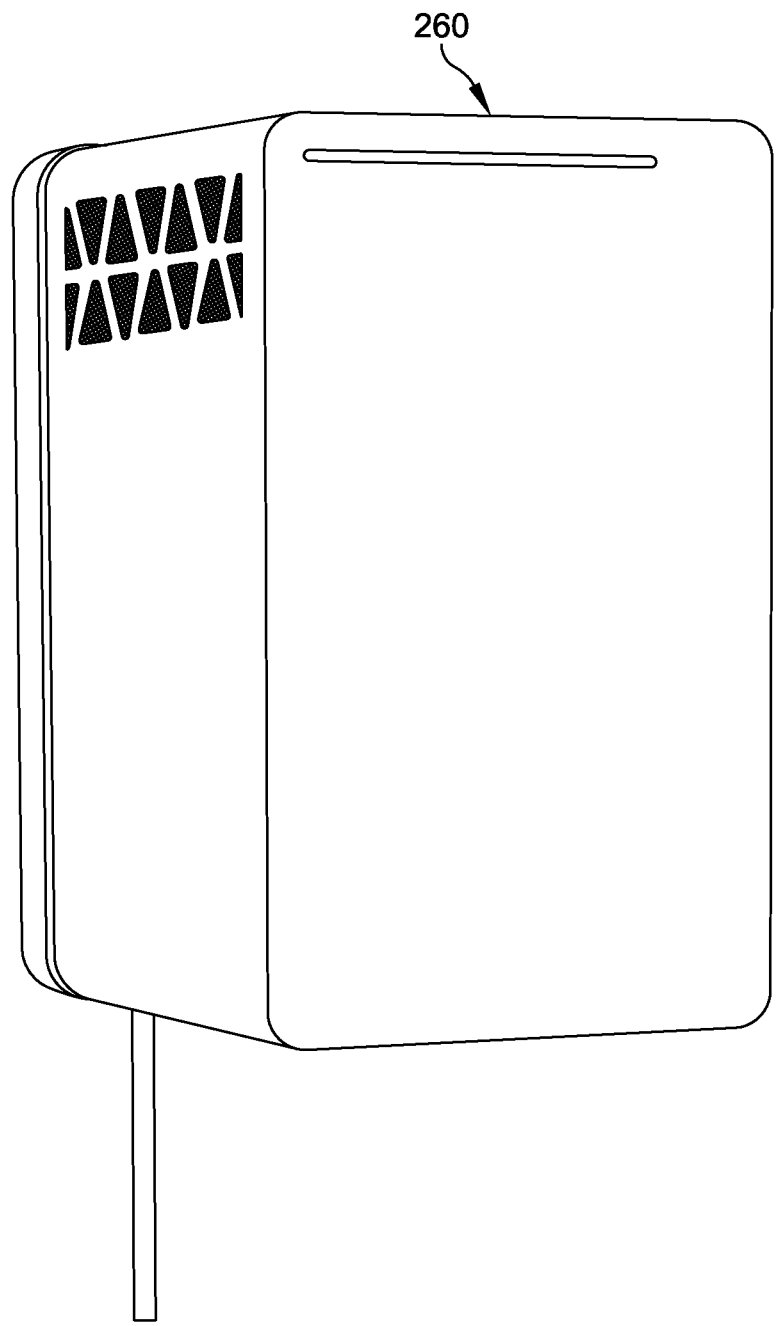
Figure 17C:
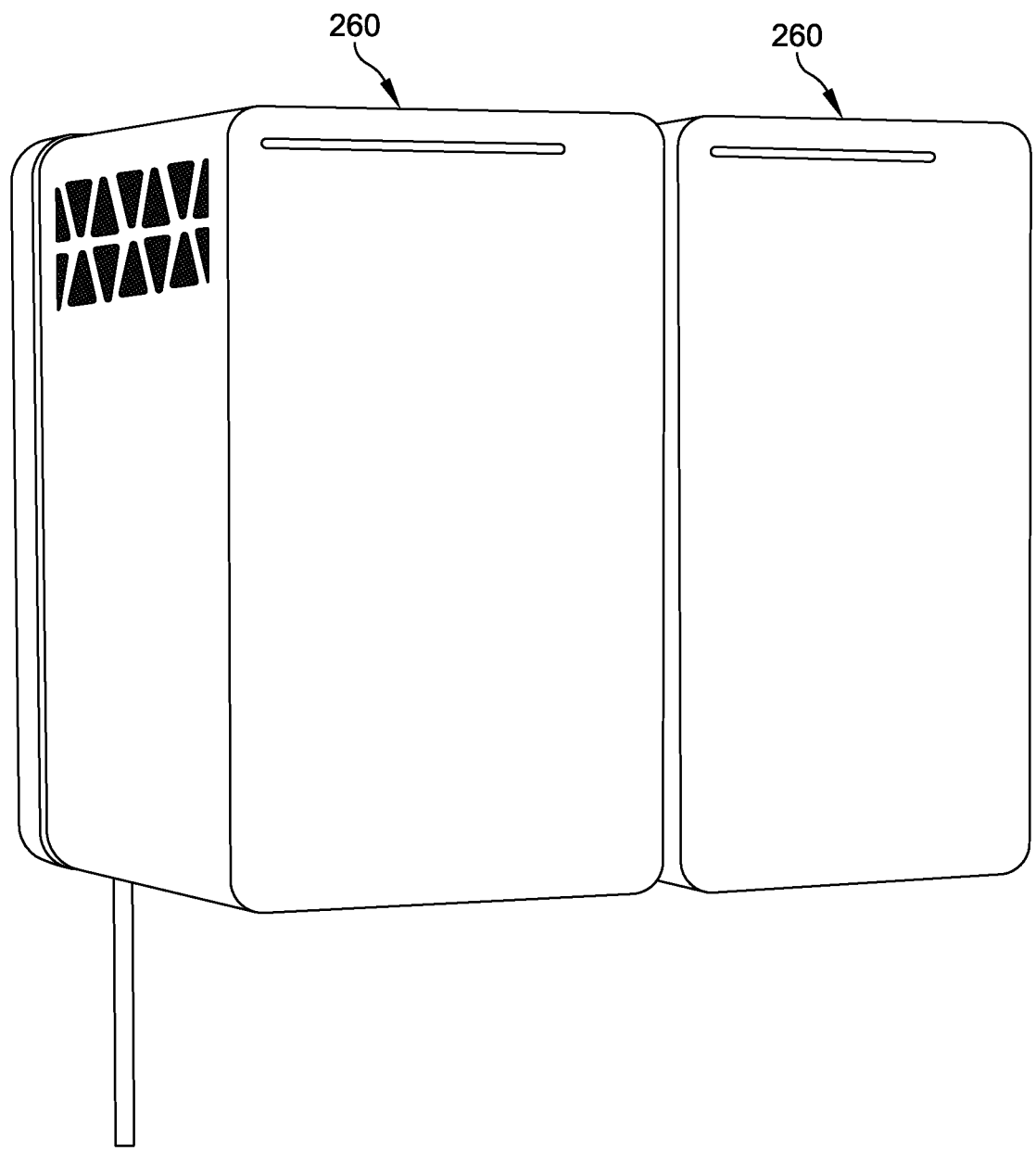

It should be understood that the modular data center 100 can be provided in a variety of shapes and sizes, and configured to support different power configurations. FIG. 17A illustrates a modular data center 240 of a 4 U (7 inches), 1-3 kilowatt (Kw) embodiment. FIG. 17B illustrates a modular data center 260 of an 8 U (14 inches), 3-6 Kw embodiment. FIG. 17C illustrates a pair of modular data centers 260 of a 12-16 U (21-28 inches), 3-6 Kw embodiment.

Figure 18:
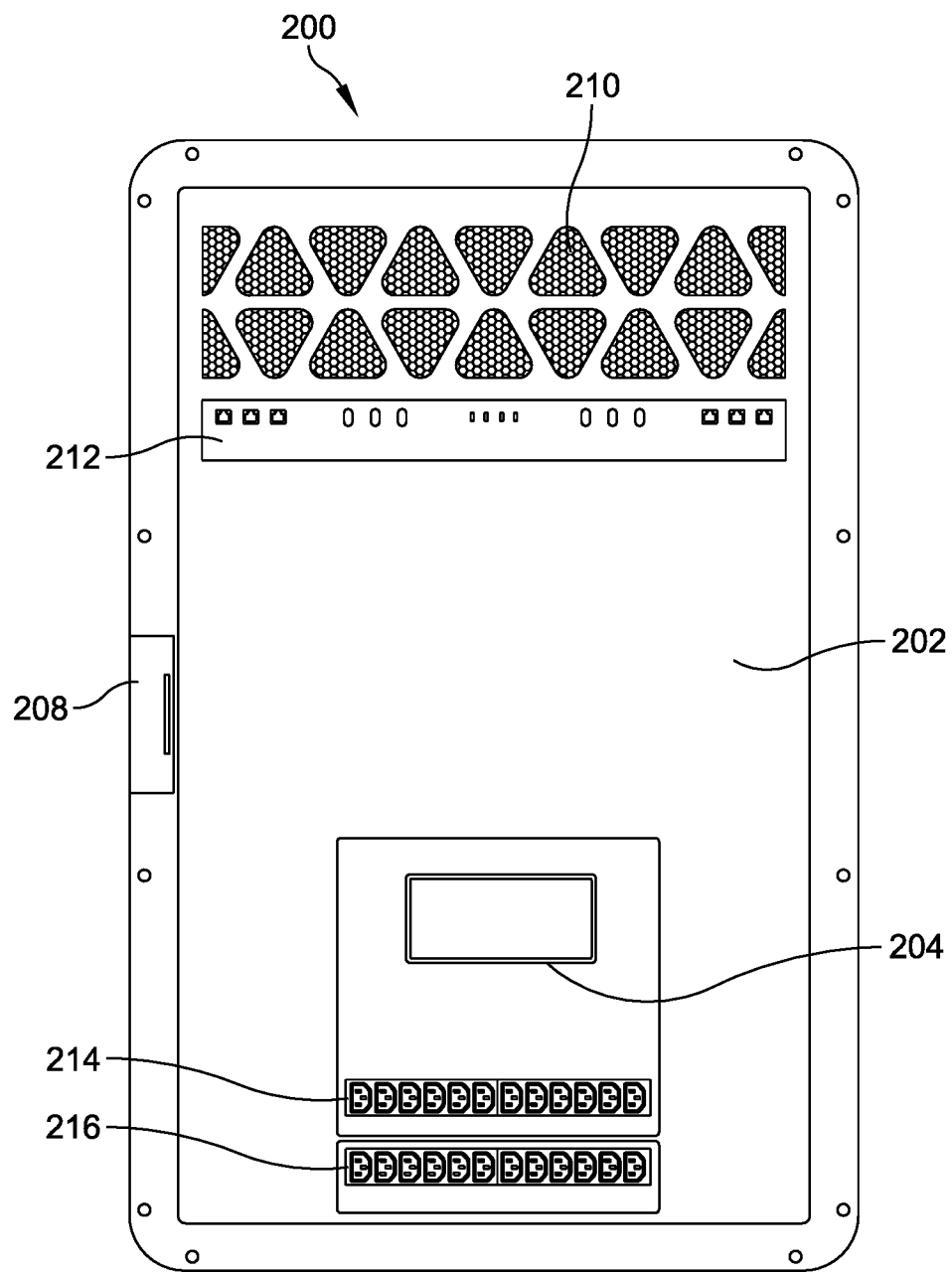
FIG. 18 is an enlarged front view of a base electrical module of an embodiment of the present disclosure.
Figure 19:
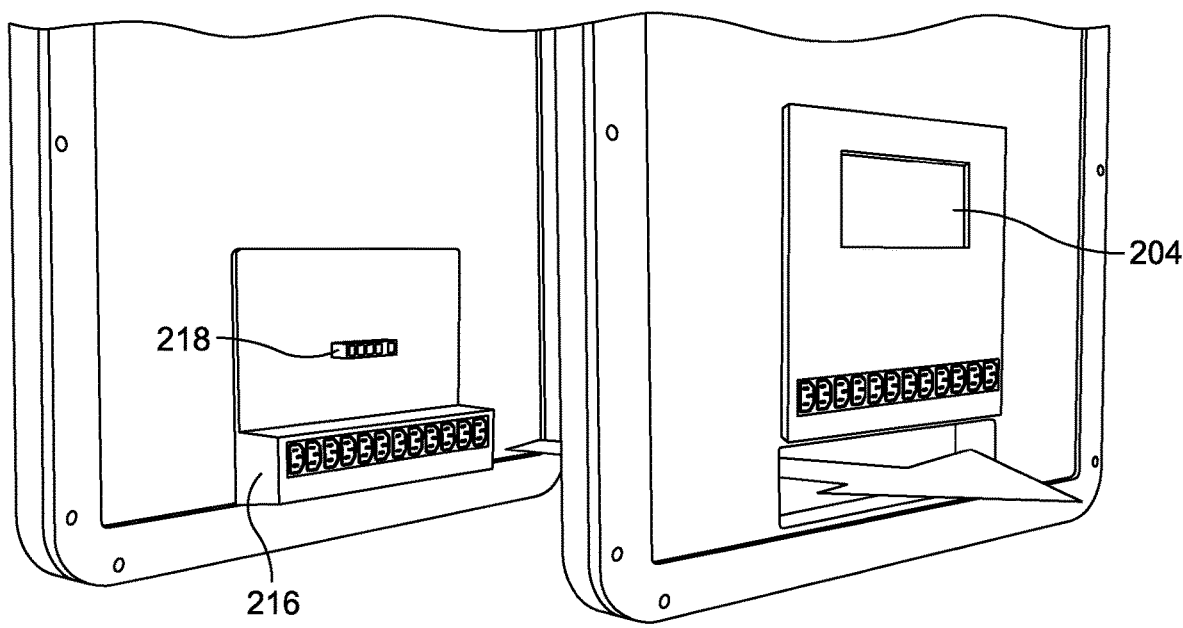
FIG. 19 is an enlarged perspective view of a portion of the base electrical module prior to assembly and installation.

Referring to FIGS. 18 and 19, aspects of the base electrical module 200 shown in FIG. 14 are illustrated in greater detail. As mentioned above, the base electrical module 200 includes the rectangular case 202 that is configured to support the components of the module. The case 202 includes the user interface 204 through which a user can monitor and/or manipulate the operation of the base electrical module 200. In one embodiment, the user interface 204 can embody a human machine interface (HMI). The case 202 further includes a handle and lock assembly 208 provided on the long side of the case opposite a hinge. In one embodiment the handle and lock 208 can be a "smart handle and lock" that enables remote access without a physical key. The case 202 further includes a series of ventilation openings indicated at 210 formed on an outer surface of the case to provide air within the interior of the case to cool components housed by the case.

In some embodiments, the base electrical module 200 is configured with a dedicated switch, e.g., a rotary or toggle switch, to bypass the UPS, keeping power applied to the PDU during UPS service. In one embodiment, the switch can be associated with the user interface 204 to bypass the UPS while keeping power applied to the PDU.

As mentioned above, the base electrical module 200 further can be configured to include management and security module having ports indicated at 212, which provide networking ports, communication ports and input ports. The base electrical module 200 further includes a smart PDU 214 and an optional additional PDU 216. FIG. 19 illustrates the installation of the additional PDU 216. As shown, the case 202 can be provided as two separate parts that are fitted together to create an integrated unit. Further, the user interface 204 can be configured to have the blind mate connector 218 between the smart PDU 214 and the additional PDU 216. The base electrical module 200 is configured to provide selective power to the IT equipment housed within the IT equipment rack. In one embodiment, the base electrical module 200 is configured to have an accommodation or feature for another module to be attached, such as the backup UPS.

In some embodiments, the management and security module includes a controller, such as controller 20 associated with base electrical module 12, to provide control of the smart PDU 214 and the additional PDU 216 along with other equipment housed by the base electrical module 200, such as a UPS.

Figure 20:
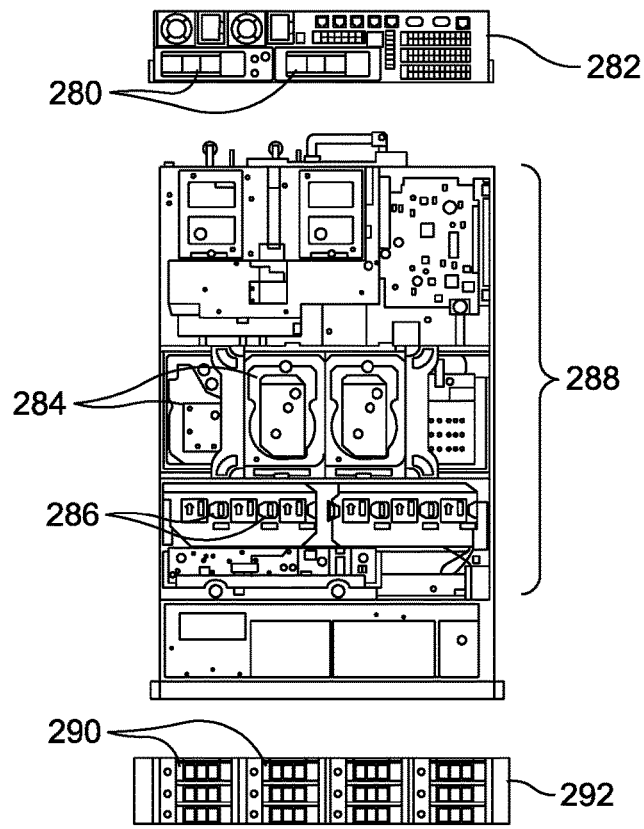
FIG. 20 is a front view of exemplary IT equipment used in an IT equipment rack of an embodiment of the present disclosure.

Referring to FIG. 20, exemplary IT equipment used in the IT equipment rack of an embodiment of the present disclosure is illustrated. As shown, the IT equipment rack includes two power supplies, each indicated at 280, with rear access 282. The power supplies 280 are suitably supported within the IT equipment rack and configured to provide power to electronic equipment serviced by the modular data center. The IT equipment rack further includes hard drives, each indicated at 284, and hot-swappable fans, each indicated at 286, with top access 288. The hard drives 284 are suitably supported within the IT equipment rack and provide data storage and the fans 286 cooling to the equipment housed within the IT equipment rack. The IT equipment rack further includes blade servers, each indicated at 290, with front access 292. The blade servers 290 are suitably supported within the IT equipment rack and are configured to have one or more microprocessors to provide processor capability.

Figure 21:
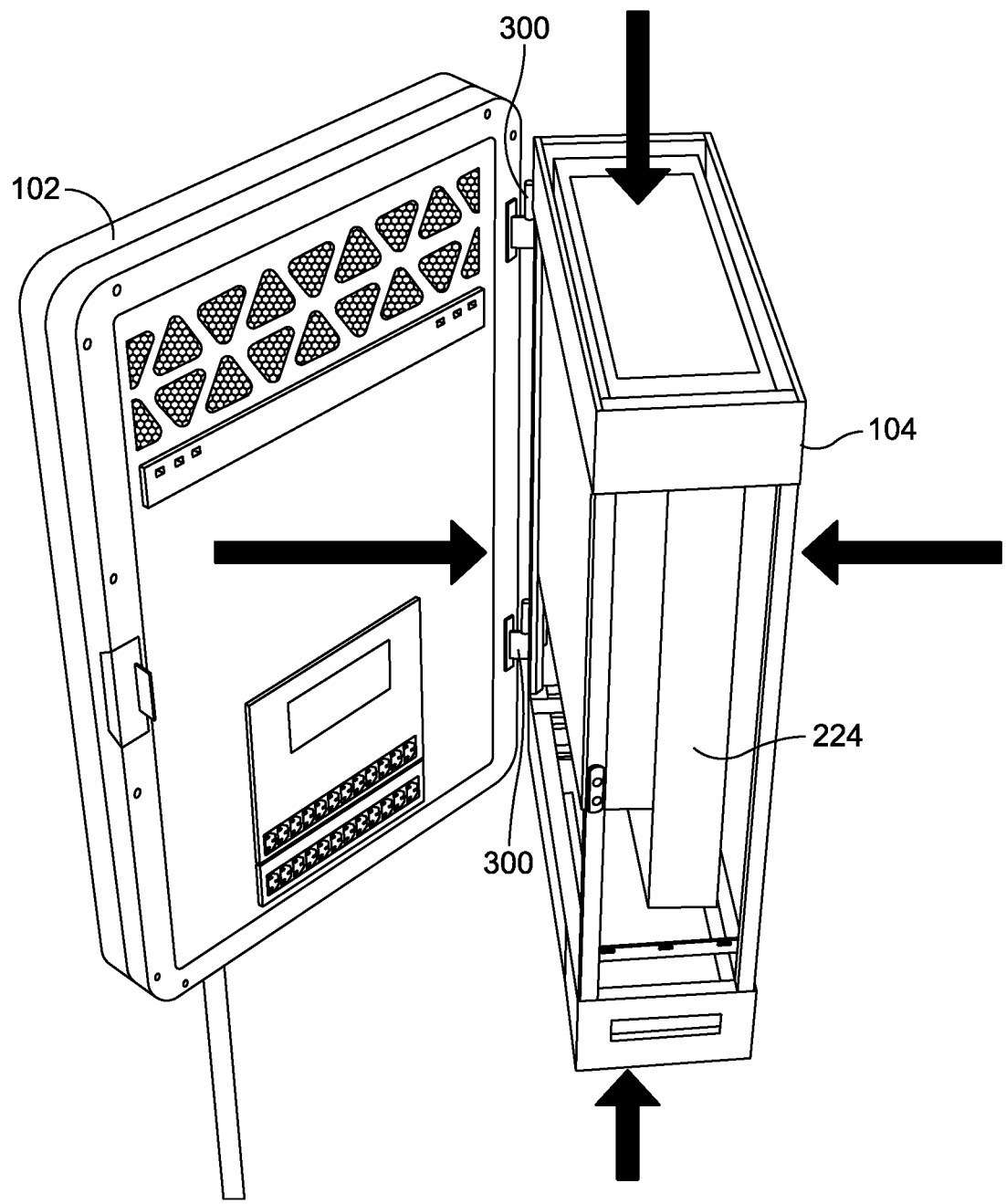
FIG. 21 is a perspective view illustrating an IT equipment rack hingedly connected to a base electrical module of an embodiment of the present disclosure.
Figure 22A:
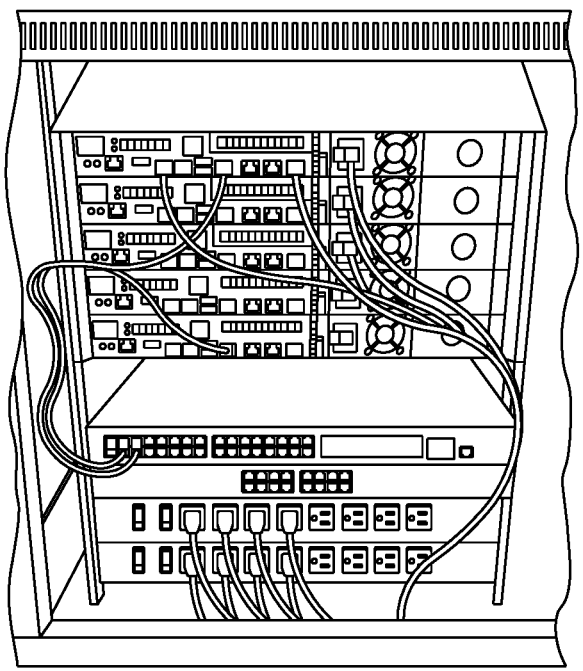
FIGS. 22A, 22B, 23A, 23B, 24A, 24B, 25A and 25B are views illustrating environmental conditions of equipment mounting for rack-mounted and panel-mounted equipment.
Figure 22B:
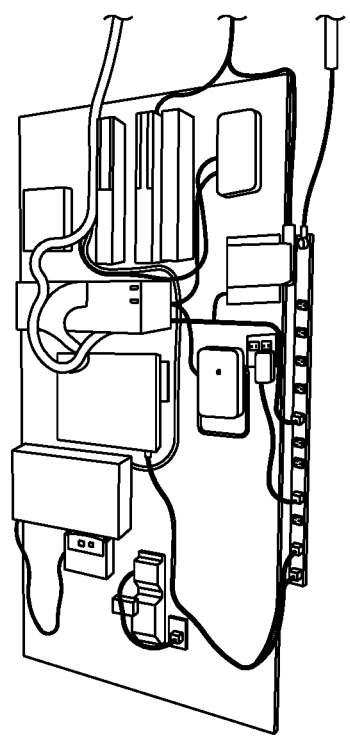
Figure 23A:
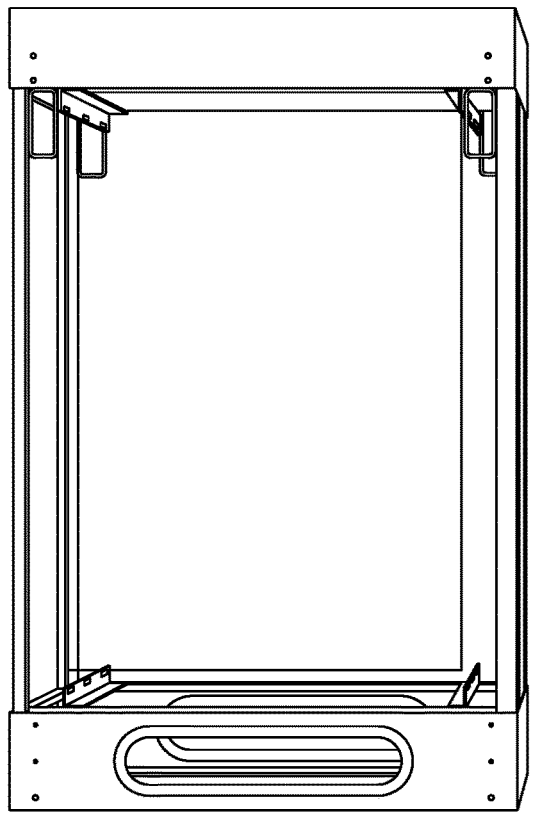
Figure 23B:
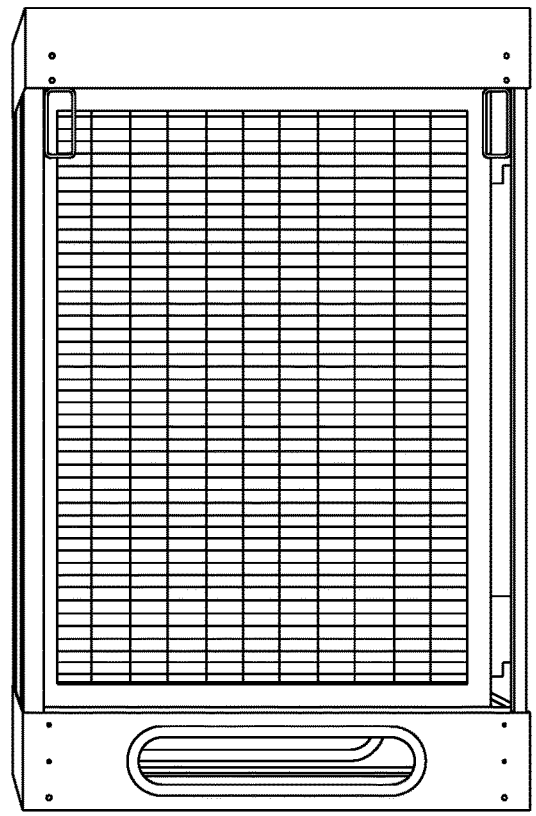
Figure 24A:
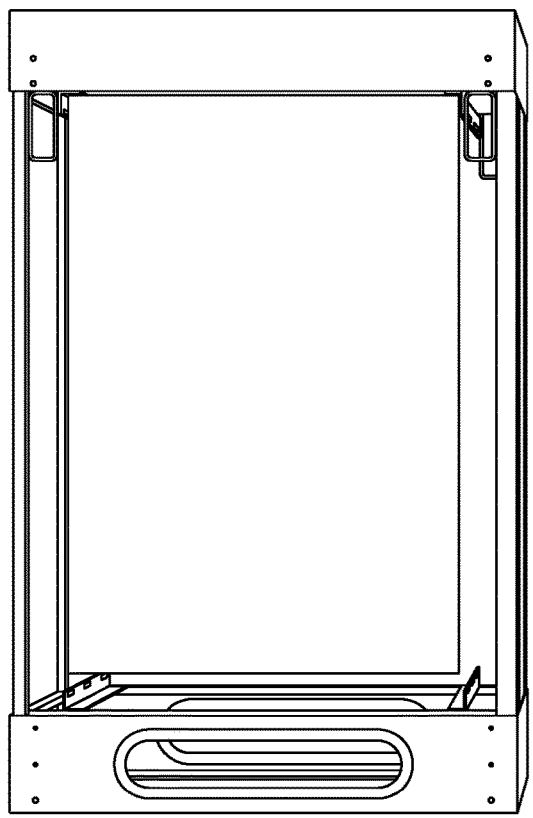
Figure 24B:
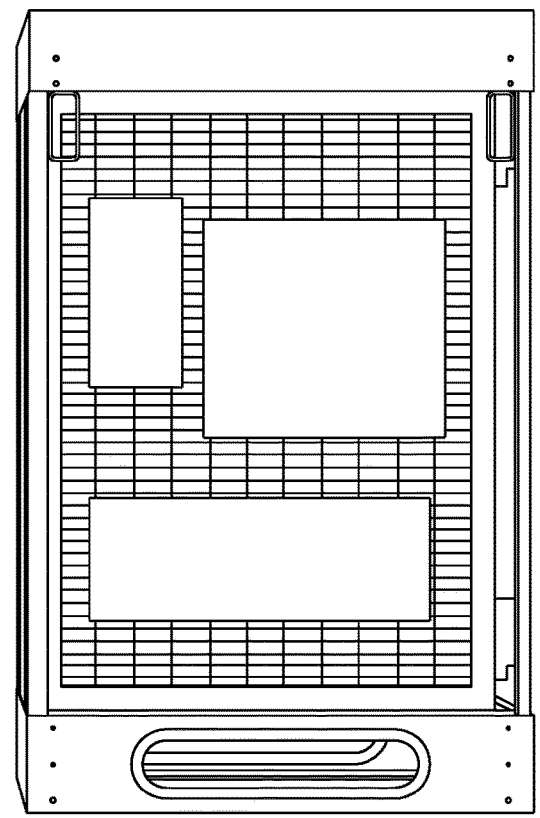
Figure 25A:
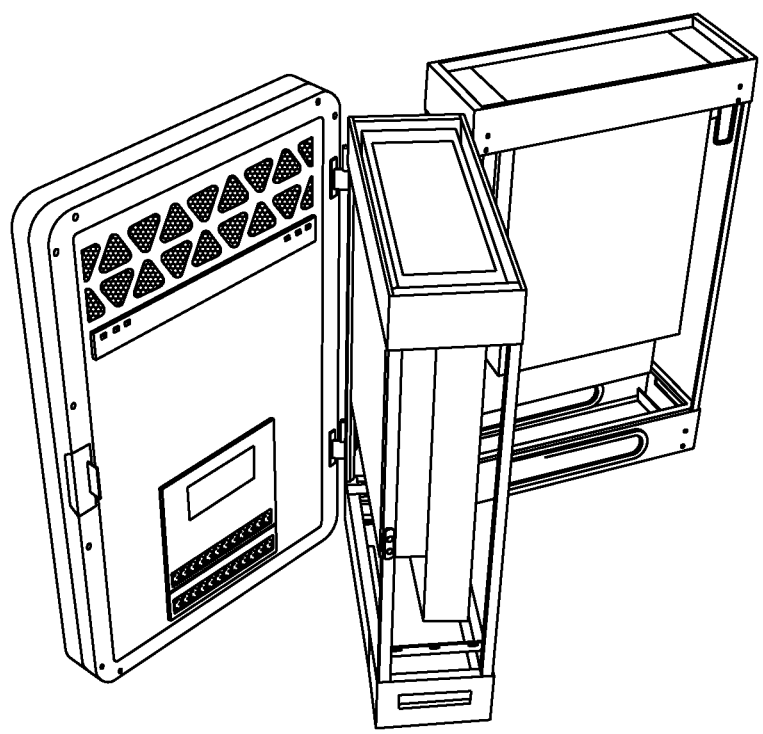
Figure 25B:
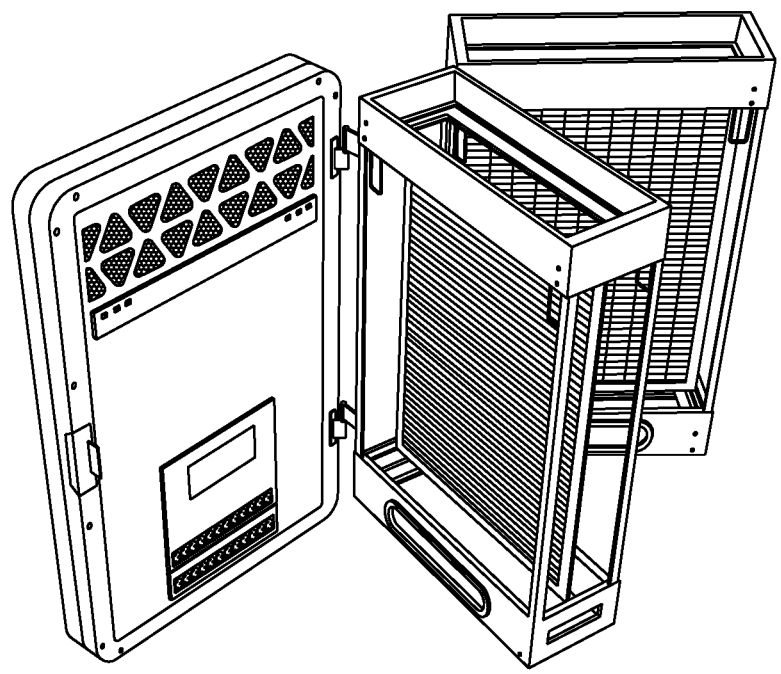

Referring to FIG. 21, the manner in which the IT equipment rack 104 is hingedly connected to the base electrical module 102 is illustrated. As shown, two hinges, each indicated at 300, are provided along respective long edges of the case of the base electrical module 102 and the IT equipment rack 104. Each hinge 300 can embody any type of hinge, such as a lift-off hinge, a corner hinge, a continuous or piano hinge, or a leaf hinge, to name a few. The IT equipment 224, when housed by the IT equipment rack 104, can be accessed from the front and back of the IT equipment rack when the IT equipment rack is in its open position with respect to the base electrical module 102. The IT equipment 224 further can be accessed from the top and/or the bottom of the IT equipment rack 104.

Referring to FIGS. 22A, 22B, 23A, 23B, 24A, 24B, 25A and 25B environmental conditions of equipment mounting for rack-mounted and panel-mounted equipment are illustrated. FIGS. 22A, 23A, 24A and 25A illustrate rack-mounted configurations of the modular data center. FIGS. 22B, 23B, 24B and 25B illustrate panel-mounted configurations of the modular data center.

Figure 26:
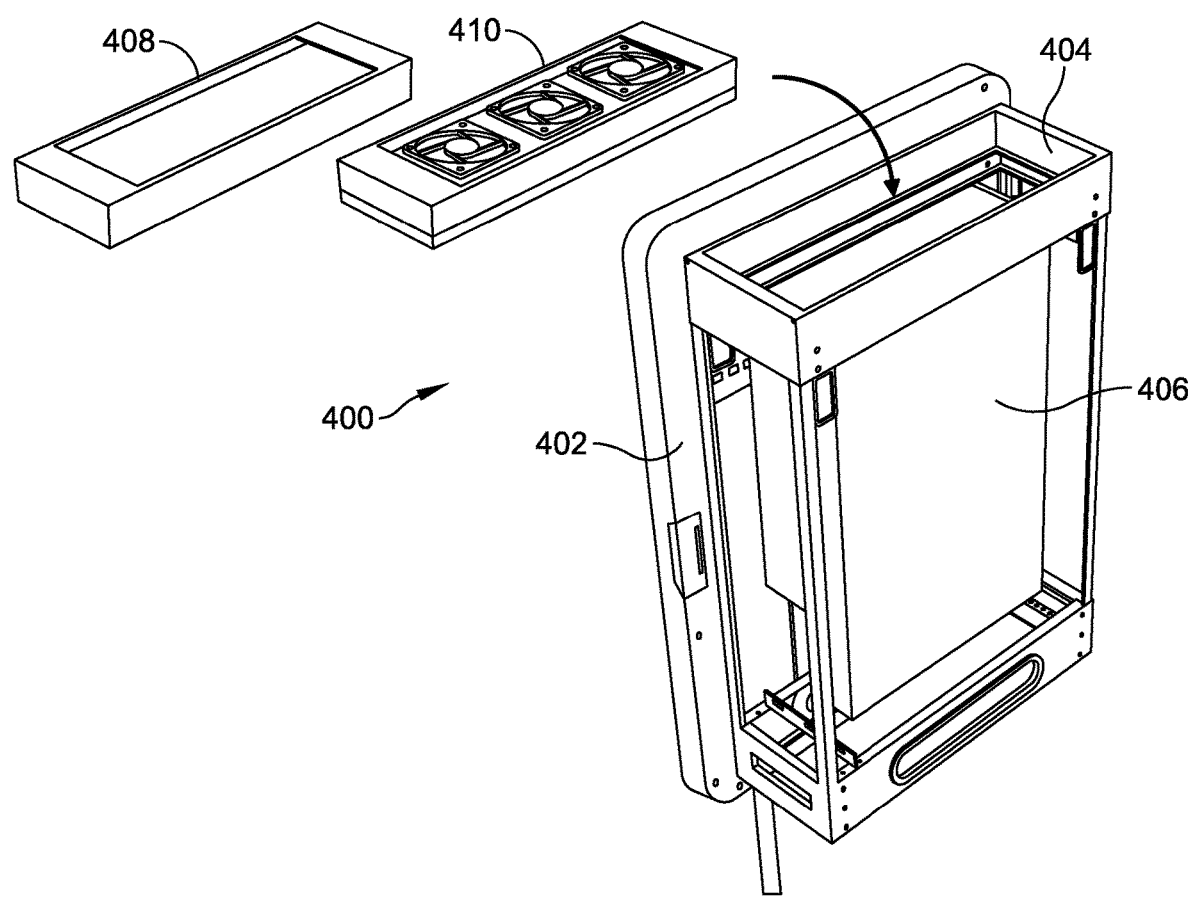
FIG. 26 is a perspective view of cooling modules being installed within an IT equipment rack.

Referring to FIGS. 26, 27, 28A, 28B, 29A, 29B and 30, air flow through a modular data center generally indicated at 400 of an embodiment of the present disclosure is illustrated. In FIG. 26, the modular data center 400 includes a base electrical module 402 and an IT equipment rack 404 having IT electrical equipment 406. As shown, the modular data center 400 further includes an active cooling module 408 and the filter and fan module 410. Airflow is configured to flow through the top of the IT equipment rack 404 of the modular data center 400, with no cover provided.

Figure 27:
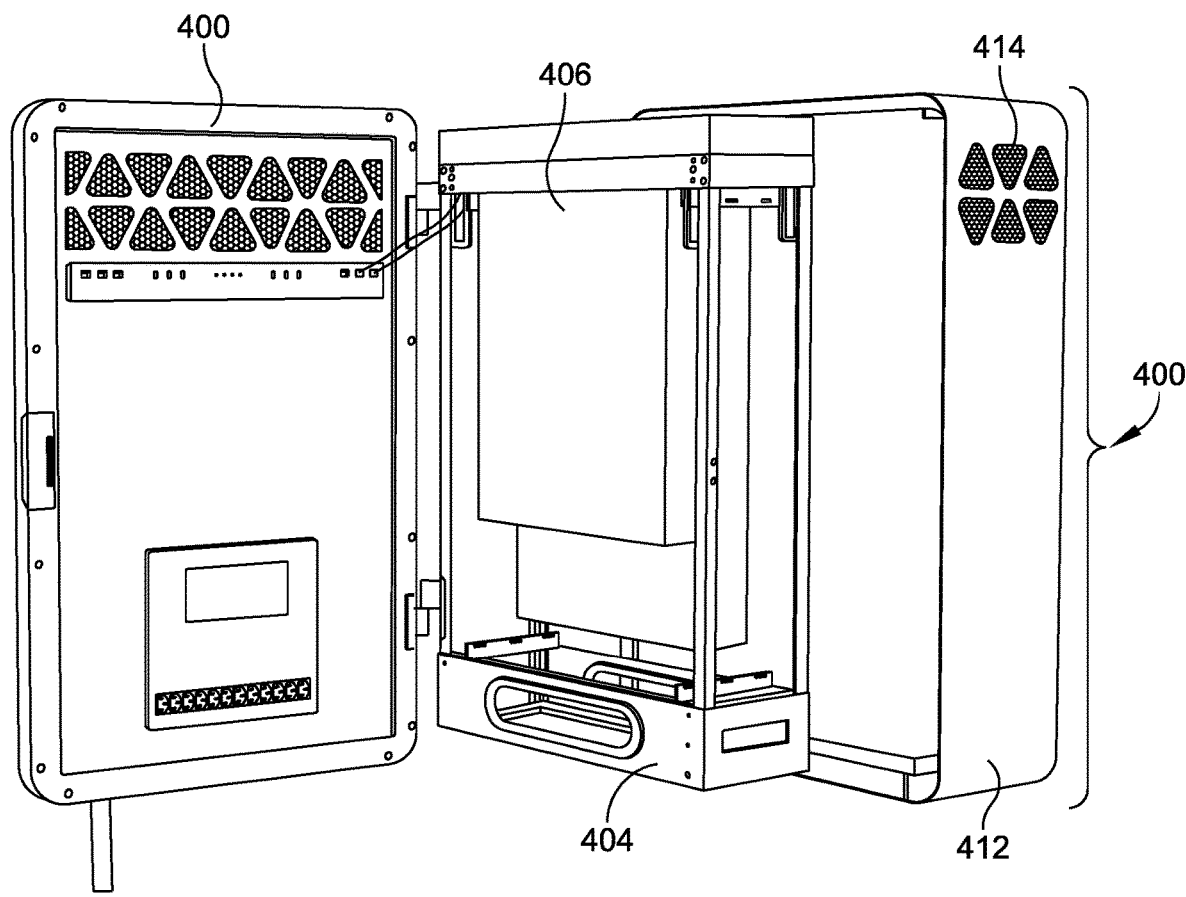
FIG. 27 is a perspective view of the IT equipment rack hingedly mounted on a base electrical module and a cover of the modular data center.

In FIG. 27, the modular data center 400 includes the base electrical module 402, the IT equipment rack 404 having IT equipment 406, and a cover 412, which encloses the base electrical module and the IT equipment rack in the manner described above. Airflow is provided to the base electrical module 402 and the IT equipment rack 404 through vents 414 provided in the cover.

Figure 28A:
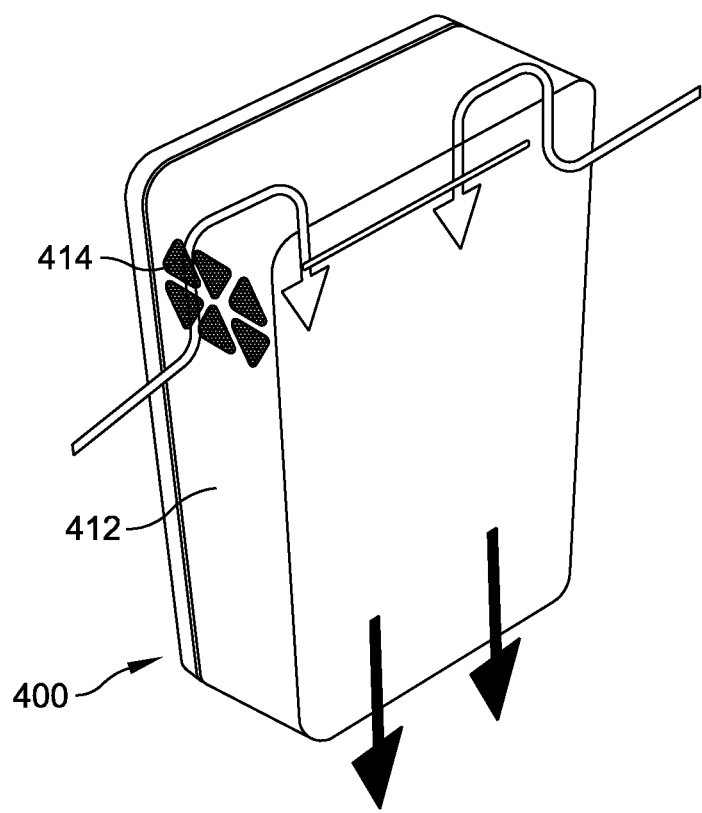
FIGS. 28A, 28B, 29A, 29B and 30 are views of air flow through a modular data center of an embodiment of the present disclosure.
Figure 28B:
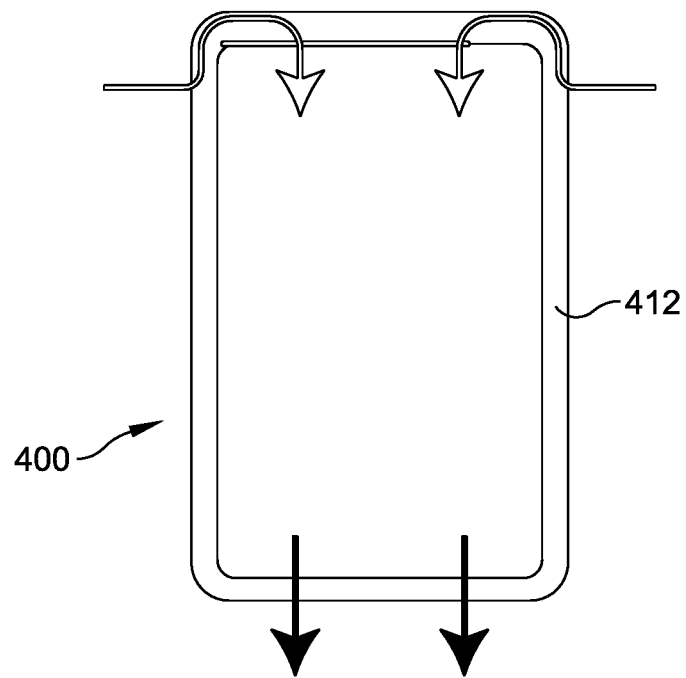

FIGS. 28A and 28B illustrate airflow through an open system of the modular data center 400. As shown, the airflow is designed to be open, meaning that cool air enters the vents 414 of the cover 412 through the sides of the cover, travels through the cover and the IT equipment, and exits out of the cover through the bottom of the cover.

Figure 29A:
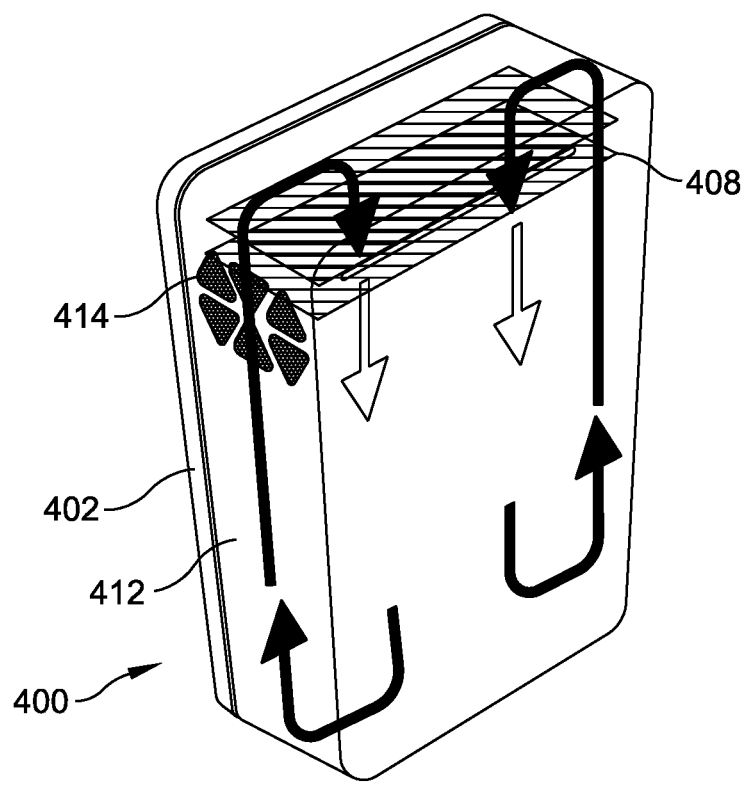
Figure 29B:
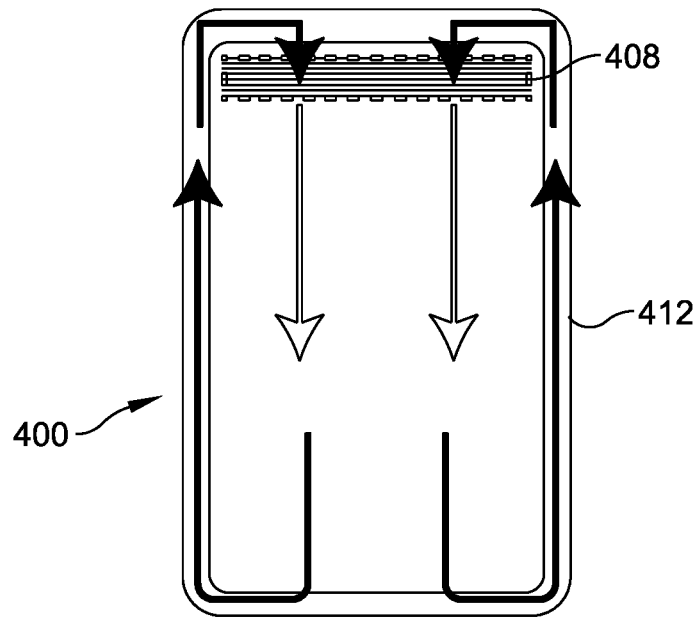

FIGS. 29A and 29B illustrate airflow through a closed system of the modular data center 400. As shown, the airflow is designed to be closed, meaning that cool air is treated by the cooling module 408 after flowing through the filter and fan module. Specifically, warm air, which traveled through the IT equipment, circulates from the bottom of cover 412 through a double wall construction of the cover to the top of the cover. The warm air flows through the filter and fan module and is cooled and/or heated by the cooling module 408. The cool air then flows through the IT equipment in which the process is repeated.

Figure 30:
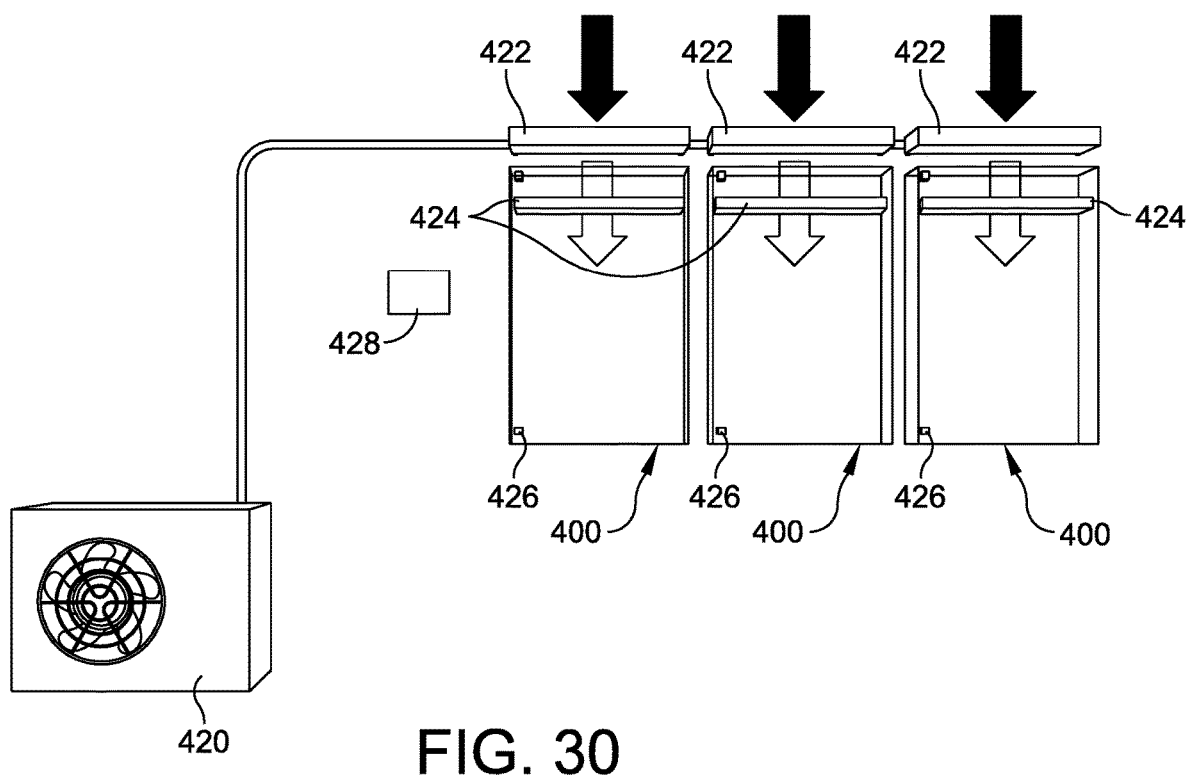

FIG. 30 illustrates airflow through multiple modular data centers 400 by means of an active cooling system. As shown, the active cooling system includes a condenser 420 that is positioned remote from the modular data centers, typically outside the facility. The condenser 420 is in fluid communication with multiple heat exchangers, each indicated at 422. In the shown embodiment, three modular data centers 400 are illustrated with three heat exchanges 422, one for each modular data center. The active cooling system further includes fan modules, each indicated at 424, housed within respective modular data centers 400, and temperature sensors, each indicated at 426, provided within the bottoms of the respective modular data centers. The active cooling system further includes a temperature and heat exchanger controller 428, which is configured to control the components of the active cooling system, including the condenser 420, the heat exchangers 422, the fan modules 424 and the temperature sensors 426.

The arrangement is such that cooled coolant is provided from the condenser 420 to the heat exchangers 422, while warm outside air flows through the heat exchangers and into the modular data centers 400. The fan modules 424 facility airflow through the heat exchangers 422. Cool air from the heat exchangers 422 is directed to IT equipment housed within the modular data centers 400 by the fan modules 424. Air warmed by the IT equipment suitably exits the modular data centers 400, while warm coolant travels back to the condenser 420 where the process is repeated. The temperature and heat exchanger controller 428 controls the flow of air through the modular data centers 400 through data provided by the temperature sensors 426.

Figure 31:
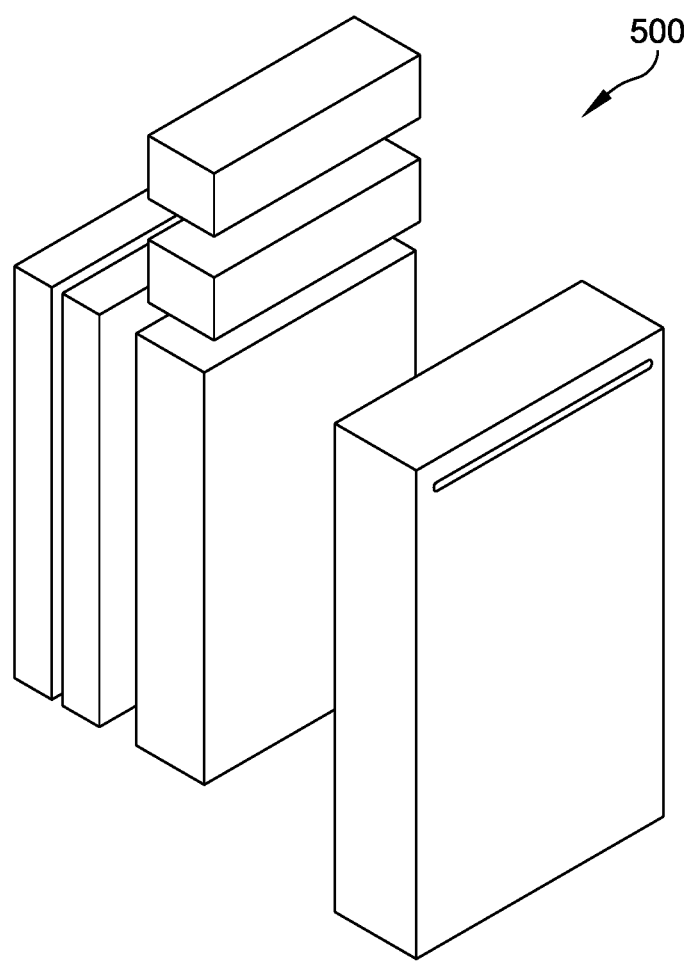
FIG. 31-35 are views of modular data centers of embodiments of the present disclosure.
Figure 32A:
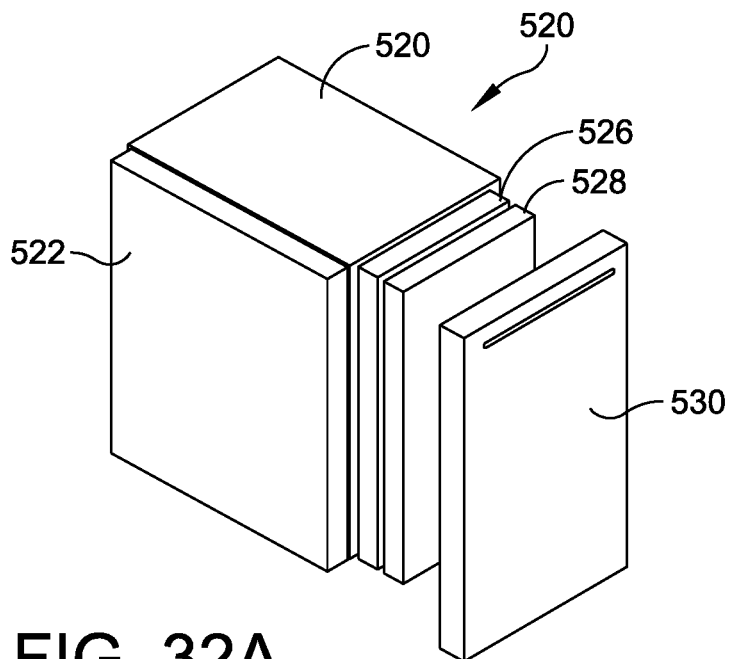
Figure 32B:
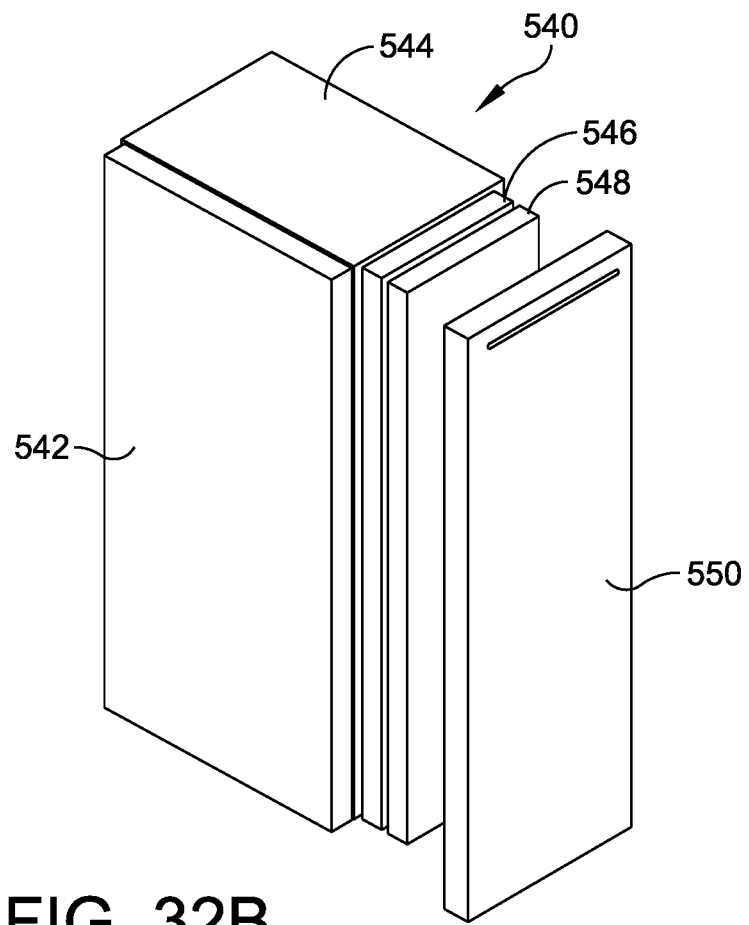

FIGS. 31, 32A, 32B and 33-35 are views of modular data centers of various embodiments of the present disclosure. For example, FIG. 31 illustrates modular data center 500, similar to the modular data center 120 shown in FIG. 9, configured as a wall mounted 4-16 U (7-28 inches) unit. FIGS. 32A and 32B illustrate IT equipment assemblies 520, 540, respectively, configured as a floor 24-42 U (42-73.5 inches) unit. As shown, the IT equipment assembly 520 includes a base electrical module 522, an IT equipment rack 524, a cooling module 526, a filter and fan module 528, and a cover 530 configured to enclose the cooling module and the filter and fan module. Similarly, the IT equipment assembly 540 includes a base electrical module 542, an IT equipment rack 544, a cooling module 546, a filter and fan module 548, and a cover 550 configured to enclose the cooling module and the filter and fan module.

Figure 33:
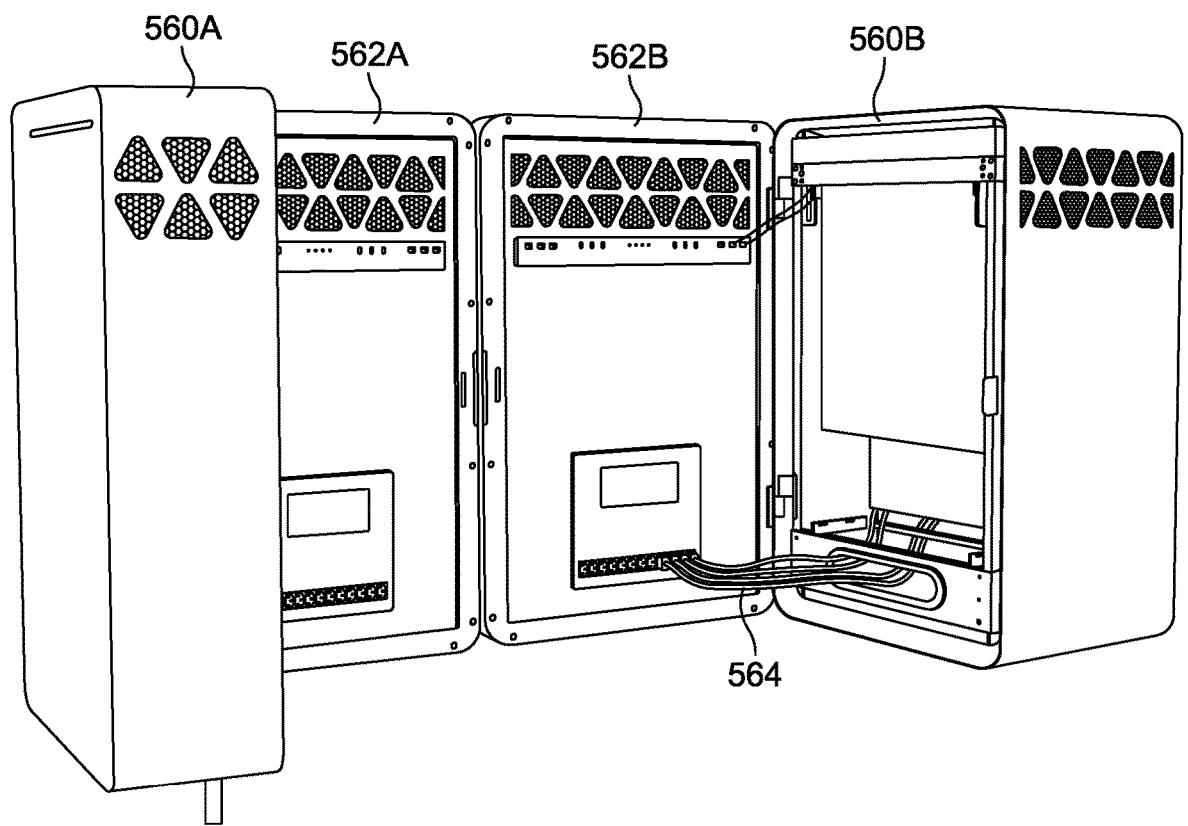

FIG. 33 illustrates a modular data center having two base electrical modules 560A, 560B and two IT equipment racks 562A, 562B hingedly connected to respective modules. As shown, one IT equipment rack 562A is hingedly connected to the base electrical module 560A along a long edge of the base electrical module. The other IT equipment rack 562B is hingedly connected to the base electrical module 560B along an opposite long edge of the base electrical module. In one embodiment, the base electrical modules 560A, 560B are coupled (power and communication) to the IT equipment housed within their respective IT equipment racks 562A, 562B by one or more cables, indicated at 564. The controller can be configured to provide selective power from the base electrical modules 560A, 560B to the IT equipment housed within the IT equipment racks 562A, 562B.

Figure 34:
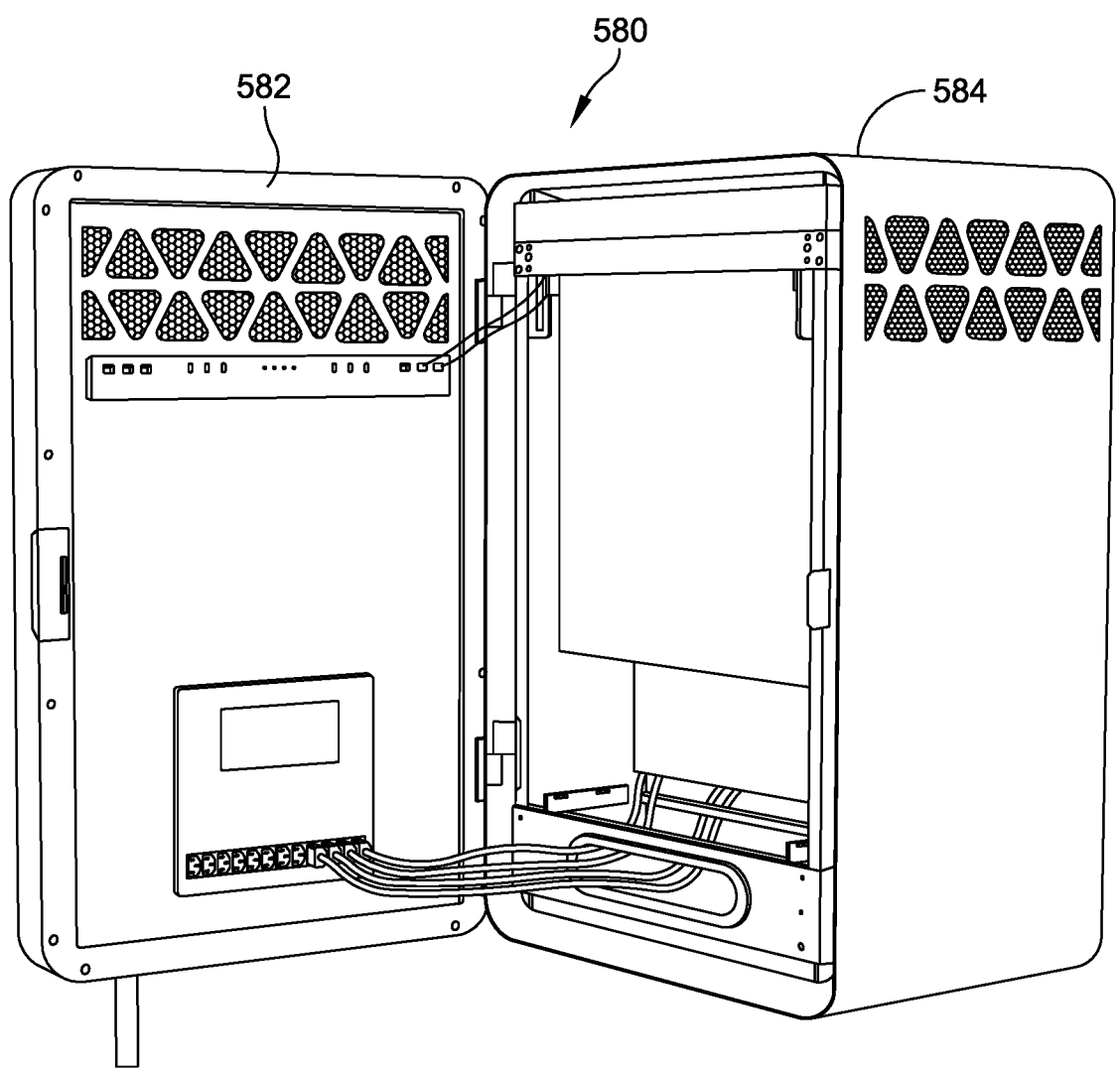
Figure 35:
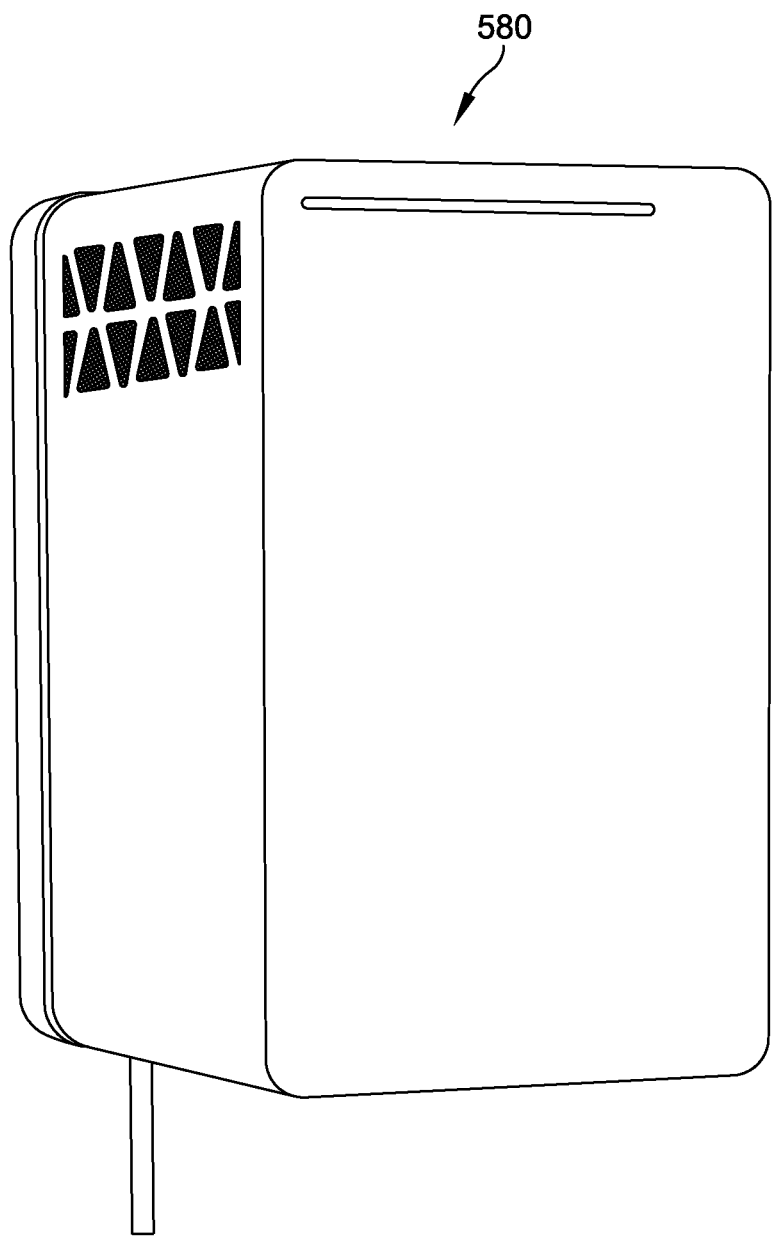

FIG. 34 illustrates a modular data center generally indicated at 580 having a base electrical module 582 and an IT equipment rack 584 hingedly connected to respective base electrical module, with the IT equipment rack being shown in an open position. FIG. 35 illustrates the IT equipment rack 580 shown in a closed position.

Various aspects and functions in accordance with the present embodiments may be implemented as specialized hardware or software executing in one or more computer systems, which may include a computer system that includes processor, memory, bus, interface, and storage. The processor may perform a series of instructions that result in manipulated data. The processor may be a commercially available processor, multi-processor, microprocessor, or controller as many other processors and controllers are available. The processor may be connected to other system elements, including one or more memory devices, by bus.

Memory may be used for storing programs and data during operation of computer system. Thus, memory may be a relatively high performance, volatile, random access memory such as a dynamic random access memory (DRAM) or static memory (SRAM). However, memory may include any device for storing data, such as a disk drive or other non-volatile, non-transitory, storage device. Various embodiments in accordance with the present disclosure may organize memory into particularized and, in some cases, unique structures to perform the aspects and functions disclosed herein.

Components of the computer system may be coupled by an interconnection element, such as a bus, which may include one or more physical busses, for example, busses between components that are integrated within a same machine, but may include any communication coupling between system elements including specialized or standard computing bus technologies such as IDE, SCSI, PCI, and InfiniBand. Thus, the bus enables communications, for example, data and instructions, to be exchanged between system components of computer system.

The computer system also may include one or more interface devices, such as input devices, output devices, and combination input/output devices. Interface devices may receive input or provide output. More particularly, output devices may render information for external presentation. The interface devices may include, for example, one or more graphical user interfaces that may be disposed proximate to or separate from other components of the computer system. A graphical user interface of the computer system may, for example, be displayed through a web browser that accesses information from the memory. Input devices may accept information from external sources. Examples of interface devices include keyboards, mouse devices, trackballs, microphones, touch screens, printing devices, display screens, speakers, network interface cards, etc. The interface devices allow computer system to exchange information and communicate with external entities, such as users and other systems.

The storage system may include a computer readable and writeable, nonvolatile, non-transitory, storage medium in which instructions are stored that define a program to be executed by the processor. The program to be executed by the processor may cause the processor or computer system to perform any one or more embodiments of the methods disclosed herein. The storage system also may include information that is recorded, on or in, the medium, and this information may be processed by the program. More specifically, the information may be stored in one or more data structures specifically configured to conserve storage space or increase data exchange performance. The instructions may be persistently stored as encoded signals, and the instructions may cause a processor to perform any of the functions described herein. The medium may, for example, be optical disk, magnetic disk, or flash memory, among others. In operation, the processor or some other controller may cause data to be read from the nonvolatile recording medium into another memory, such as memory, that allows for faster access to the information by the processor than does the storage medium included in storage system. The memory may be located in storage system or in memory, however, processor may manipulate the data within the memory, and then may copy the data to the medium associated with storage system after processing is completed. A variety of components may manage data movement between the medium and integrated circuit memory element and the presently described embodiments are not limited thereto. Further, the embodiments are not limited to a particular memory system or data storage system. Portions of the memory or storage system may be included in the same computer system as other components of the computer system or may be resident in a cloud-based system that is accessible via the internet or other communications system or protocol.

Although the computer system is shown by way of example as one type of computer system upon which various aspects and functions in accordance with the present embodiments may be practiced, any aspects of the presently disclosed embodiments are not limited to being implemented on the computer system. Various aspects and functions in accord with the presently disclosed embodiments may be practiced on one or more computers having a different architectures or components. For instance, computer system may include specially-programmed, special-purpose hardware, such as for example, an application-specific integrated circuit (ASIC) tailored to perform a particular operation disclosed herein. While another embodiment may perform the same function using several general-purpose computing devices running MAC OS System X with Motorola PowerPC processors and several specialized computing devices running proprietary hardware and operating systems.

The computer system may be a computer system including an operating system that manages at least a portion of the hardware elements included in computer system. Usually, a processor or controller, such as processor, executes a commercially available operating system. Many types of operating systems may be used, and embodiments are not limited to any particular implementation.

The processor and operating system together define a computer platform for which application programs in high-level programming languages may be written. These component applications may be executable, intermediate, for example, C—, bytecode or interpreted code which communicates over a communication network, for example, the Internet, using a communication protocol, for example, TCP/IP. Similarly, aspects in accord with the presently disclosed embodiments may be implemented using an object-oriented programming language, such as .Net, Small-Talk, Java, C++, Ada, or C# (C-Sharp). Other object-oriented programming languages may also be used. Alternatively, functional, scripting, or logical programming languages may be used.

Additionally, various aspects and functions in accordance with the presently disclosed embodiments may be implemented in a non-programmed environment, for example, documents created in HTML, XML, or other format that, when viewed in a window of a browser program, render aspects of a graphical-user interface or perform other functions. Further, various embodiments in accord with the present disclosure may be implemented as programmed or non-programmed elements, or any combination thereof. For example, a web page may be implemented using HTML while a data object called from within the web page may be written in C++. Thus, the presently disclosed embodiments are not limited to a specific programming language and any suitable programming language could also be used.

A computer system included within an embodiment may perform additional functions outside the scope of the presently disclosed embodiments. For instance, aspects of the system may be implemented using an existing commercial product, such as, for example, Database Management Systems such as SQL Server available from Microsoft of Seattle Wash., Oracle Database from Oracle of Redwood Shores, Calif., and MySQL from MySQL AB, a subsidiary of Oracle or integration software such as Web Sphere middleware from IBM of Armonk, N.Y. However, a computer system running, for example, SQL Server may be able to support both aspects in accord with the presently disclosed embodiments and databases for sundry applications.

Advantages

Embodiments of the base electrical module are configured to solve the following issues associated with conventional hangable IT racks.

Expensive electrician time is needed during entire installation process where MDC is unboxed and assembled at the site. With the base electrical module of the present disclosure, a smaller base electrical module can be quickly unpacked and installed by the electrician at the same time the site wiring is installed thereby allowing subsequent installation, service to be performed by IT integrators, users, system people after the electrician has completed his or her work quickly.

Uninstalled IT equipment clutters a work site while construction progresses, risking damage until system installers and integrators are deployed at the end of the project. Given the late phase of site commissioning, such IT equipment is at risk of loss or damage. With the base electrical module of the present disclosure, modules can be shipped just in time for the appropriate construction and commission phase thereby allowing better capital utilization and greatly reducing the risk of IT system losses.

System integration must be performed at one partner location, mandating both electrical and IT Skills to be present. Such diversity of skills may not be congruent to a business model in a competitive industry. With the base electrical module of the present disclosure, modules can be configured and integrated at separate sites with final site integration, and can be configured to include including a simple connection of IT module(s) to power module(s), and can be done with available field resources.

Final micro data center may be too large, heavy, or awkward for site team to install. One story of a 6-U MDC pre-integrated and shipped required disassembly at the site in order to be light enough to hang on the wall-mount as intended, destroying the benefit of pre-integration. With the base electrical module of the present disclosure, separate field installable modules are smaller and lighter, which enables a limited site crew to install MDC in space optimized position, such as vertical wall mount.

Customer must order MDC in fixed size increments that are difficult to modify in the field. If the customer initially selects a compact 6-U MDC, the customer is forced to upgrade to a new larger U solution resulting in wasted material, resources, time, and costs. If the customer initially selects a larger 24- or 48-U half-height or full-height cabinet, they lose the advantage of space optimization. With the base electrical module of the present disclosure, the stackable modular rack design enables cost-competitive future expansion, giving user peace of mind and flexible business options.

It is to be appreciated that examples of the methods, systems, and apparatuses discussed herein are not limited in application to the details of construction and the arrangement of components set forth in the following description or illustrated in the accompanying drawings. The methods, systems, and apparatuses are capable of implementation in other examples and of being practiced or of being carried out in various ways. Examples of specific implementations are provided herein for illustrative purposes only and are not intended to be limiting. Examples disclosed herein may be combined with other examples in any manner consistent with at least one of the principles disclosed herein, and references to "an example," "some examples," "an alternate example," "various examples," "one example" or the like are not necessarily mutually exclusive and are intended to indicate that a particular feature, structure, or characteristic described may be included in at least one example. The appearances of such terms herein are not necessarily all referring to the same example. Also, the phraseology and terminology used herein is for the purpose of description and should not be regarded as limiting. The use herein of "including," "comprising," "having," "containing," "involving," and variations thereof is meant to encompass the items listed thereafter and equivalents thereof as well as additional items. References to "or" may be construed as inclusive so that any terms described using "or" may indicate any of a single, more than one, and all of the described terms. Any references to front and back, left and right, top and bottom, upper and lower, and vertical and horizontal are intended for convenience of description, not to limit the present systems and methods or their components to any one positional or spatial orientation.

Having thus described several aspects of at least one embodiment of this disclosure, it is to be appreciated various alterations, modifications, and improvements will readily occur to those skilled in the art. Such alterations, modifications, and improvements are intended to be part of this disclosure, and are intended to be within the spirit and scope of the disclosure. Accordingly, the foregoing description and drawings are by way of example only.

What is claimed is:

1. A modular data center comprising:
    a base electrical module including a casing, a controller supported by the casing, and a power distribution unit coupled to the controller, the power distribution unit including a plurality of outlets; and
    an equipment rack including a frame coupled to the base electrical module, the frame of the equipment rack being configured to receive electronic equipment,
    wherein the electronic equipment receives power from the power distribution unit of the base electrical module, and
    wherein the base electrical module is external to the equipment rack.

2. The modular data center of claim 1, wherein the base electrical module further includes a support configured to be secured to the casing.

3. The modular data center of claim 2, wherein the support is configured to be hingedly connected to the frame of the equipment rack.

4. The modular data center of claim 1, wherein the base electrical module further includes an additional power distribution unit.

5. The modular data center of claim 1, wherein the base electrical module further includes one or more hardwire connections.

6. The modular data center of claim 1, wherein the base electrical module further includes an accommodation or feature for a module to be attached.

7. The modular data center of claim 1, wherein the base electrical module further includes one or more power distribution unit connections.

8. The modular data center of claim 1, wherein the base electrical module further includes an uninterruptible power supply ("UPS").

9. The modular data center of claim 8, wherein the base electrical module further is configured to bypass the UPS, while keeping power applied to the PDU during UPS service.

10. The modular data center of claim 1, wherein the base electrical module further includes a management and security module.

11. The modular data center of claim 10, wherein the base electrical module further includes a user interface coupled to the management and security module.

12. The modular data center of claim 10, wherein the management and security module is coupled to the controller and the power distribution unit to provide control to the power distribution unit.

13. The modular data center of claim 1, further comprising at least one backup UPS.

14. The modular data center of claim 1, further comprising a cover configured to enclose the base electrical module and the equipment rack.

15. The modular data center of claim 1, further comprising a cooling module to provide cooling and/or heating to the equipment rack.

16. The modular data center of claim 15, further comprising a filter and fan module in fluid communication with the cooling module.

17. The modular data center of claim 16, wherein the equipment rack further is configured to receive at least one of the cooling module or the filter and fan module.

18. The modular data center of claim 17, further comprising a cover configured to enclose the base electrical module, the equipment rack, and at least one of the cooling module or the filter and fan module.

19. The modular data center of claim 1, wherein the equipment rack is further configured to receive hot-swappable electronic equipment.

20. A method of assembling and installing a modular data center, the method comprising:
    installing a base electrical module on a surface, the base electrical module including a casing, a controller supported by the casing, and a power distribution unit coupled to the controller, the power distribution unit including a plurality of outlets; and
    hingedly connecting an equipment rack to the base electrical module, the equipment rack including a frame coupled to the base electrical module, the frame of the equipment rack being configured to receive electronic equipment,
    wherein the electronic equipment receives power from the power distribution unit of the base electrical module, and
    wherein the base electrical module is external to the equipment rack.

21. The method of claim 20, further comprising securing a backup UPS module to the base electrical module.

22. The method of claim 20, further comprising securing a cover to the base electrical module and the equipment rack.

23. The method of claim 20, further comprising providing a cooling module to provide cooling and/or heating to the equipment rack.

24. The method of claim 23, further comprising providing a filter and fan module in fluid communication with the cooling module.

25. The method of claim 20, wherein installing the base electrical module includes securing a support to the casing of the base electrical module.

26. The method of claim 25, wherein the equipment rack is configured to be hingedly connected to the support.

* * * * *